United States Patent
Tani et al.

(10) Patent No.: US 9,041,080 B2
(45) Date of Patent: May 26, 2015

(54) SEMICONDUCTOR OPTICAL ELEMENT

(75) Inventors: Kazuki Tani, Tokyo (JP); Shinichi Saito, Tokyo (JP); Katsuya Oda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/376,662

(22) PCT Filed: Aug. 2, 2012

(86) PCT No.: PCT/JP2012/069677
§ 371 (c)(1),
(2), (4) Date: Oct. 17, 2014

(87) PCT Pub. No.: WO2013/118327
PCT Pub. Date: Aug. 15, 2013

(65) Prior Publication Data
US 2015/0055669 A1 Feb. 26, 2015

(30) Foreign Application Priority Data

Feb. 6, 2012 (WO) .................. PCT/JP2012/052642

(51) Int. Cl.
*H01L 29/00* (2006.01)
*H01S 5/32* (2006.01)

(52) U.S. Cl.
CPC .................................... *H01S 5/3223* (2013.01)

(58) Field of Classification Search
CPC .......... H01L 27/15; H01L 33/18; H01L 33/34
USPC ............ 257/E27.12, E33.005, 200, 290, 347, 257/50, 51, 78, 88, 90, 94
See application file for complete search history.

(56) References Cited

U.S. PATENT DOCUMENTS 6,157,047 A * 12/2000 Fujita et al. ...................... 257/51
2007/0238278 A1* 10/2007 Mathew et al. ............... 438/595
(Continued)

FOREIGN PATENT DOCUMENTS

JP 2005-530360 A 10/2005
JP 2007-173590 A 7/2007
(Continued)

OTHER PUBLICATIONS

Zhang, et al., "Prediction that Uniaxial Tension along (111) Produces a Direct Band Gap in Germanium", Physical Review Letters, 102, 2009, pp. 156401-1-156401-4, Apr. 17, 2009.
(Continued)

*Primary Examiner* — Stephen W Smoot
*Assistant Examiner* — Edward Chin
(74) *Attorney, Agent, or Firm* — Baker Botts L.L.P.

(57) ABSTRACT

To provide a light-emitting element where electrons are efficiently injected into a Ge light emission layer and light can be efficiently emitted, the light-emitting element has a barrier layer 3 which is formed on an insulating film 2, worked in a size in which quantum confinement effect manifests and made of monocrystalline Si, a p-type diffused layer electrode 5 and an n-type diffused layer electrode 6 respectively provided at both ends of the barrier layer 3, and a monocrystalline Ge light emission part 13 provided on the barrier layer 3 between the electrodes 5, 6. At least a part of current that flows between the electrodes 5, 6 flows in the barrier layer 3 in a horizontal direction with respect to a substrate 1.

17 Claims, 30 Drawing Sheets

(56) References Cited

U.S. PATENT DOCUMENTS

| | | | |
|---|---|---|---|
| 2011/0044362 A1 | 2/2011 | Wada et al. | |
| 2013/0240957 A1* | 9/2013 | Lee et al. | 257/288 |
| 2013/0340525 A1* | 12/2013 | Liu | 73/514.11 |
| 2013/0340526 A1* | 12/2013 | Liu | 73/514.32 |
| 2014/0048910 A1* | 2/2014 | Liu | 257/621 |
| 2014/0217421 A1* | 8/2014 | Zhu et al. | 257/77 |

FOREIGN PATENT DOCUMENTS

| | | |
|---|---|---|
| JP | 2007-294628 A | 11/2007 |
| JP | 2008-508702 A | 3/2008 |
| JP | 2009-76498 A | 4/2009 |
| JP | 2009-514231 A | 4/2009 |
| WO | 2004/001857 A1 | 12/2003 |
| WO | 2006/010618 A1 | 2/2006 |
| WO | 2007/053431 A2 | 5/2007 |

OTHER PUBLICATIONS

Sun, et al., "Room-temperature direct bandgap electroluminescence from Ge-on-Si light-emitting diodes", Optics Letters, vol. 34, No. 8, 2009, pp. 1198-1200.

* cited by examiner

SEMICONDUCTOR OPTICAL ELEMENT

TECHNICAL FIELD

The present invention relates to a light-emitting element using a Group IV element.

BACKGROUND ART

In a broadband network that supports Internet industry, optical communication is adopted. A laser diode using a compound semiconductor such as Group III-V and Group II-VI is used for optical transmission and reception in the optical communication.

In the meantime, information processing and storage are performed in LSI based upon silicon and the transmission of information is performed by a laser based upon a compound semiconductor. A field of research that tries to realize close optical wiring between silicon chips or in a silicon chip by an optical element using silicon is called silicon photonics. This is technique that tries to produce an optical element using a refined silicon line widely popularized in the world. Currently, a large scale integrated circuit (LSI) based upon a complementary metal-oxide semiconductor (CMOS) is produced in these silicon lines. However, it is considered that in future, merged circuit technology of photonics and electronics acquired by integrating an optical circuit by such silicon photonics with a CMOS circuit will be realized.

In silicon photonics, the most challenging object is a light source. The reason is that as silicon and germanium in bulk are an indirect semiconductor, their efficiency of light emission is extremely bad.

Then, a method of converting silicon and germanium to a direct-transition semiconductor to make the silicon and the germanium efficiently emit is proposed.

For one of methods of converting germanium to a direct-transition semiconductor, a method of applying extensional strain is known. When extensional strain is applied to germanium, energy at a point $\Gamma$ in a conduction band decreases according to the magnitude of the strain. When energy at the point $\Gamma$ becomes smaller than energy at a point $L$ as a result of applying extensional strain, germanium converts to a direct-transition semiconductor (refer to Patent Literatures 1 to 6 and Non-patent Literatures 1, 2).

In Non-patent Literature 1, it is reported that germanium converts to a direct-transition semiconductor by applying extensional strain of approximately 2 GPa. Besides, for a method of production, Patent Literature 2 discloses a method of directly epitaxially growing a germanium layer on a silicon wafer and applying extensional strain to the germanium layer utilizing difference in a coefficient of thermal expansion between silicon and germanium. In addition, as an energy gap between a point $L$ at the bottom of a conduction band of germanium and a point $\Gamma$ which is energy of direct transition is 0.136 eV and is small, carriers are also injected at the point $\Gamma$ if carriers are injected at high density even if germanium does not completely convert to a direct-transition semiconductor, and an electron and a hole can be recombined in a direct transition type. Patent Literature 3 discloses technique for producing a laser diode by epitaxially growing a germanium layer to which extensional strain of 0.25%, is applied on a silicon substrate, injecting carriers at high density though the germanium layer does not convert to a direct transition type and emitting light. Non-patent Literature 2 discloses a light-emitting diode (hereinafter called LED) produced using a germanium layer epitaxially grown on a silicon substrate. Patent Literature 4 discloses technique for forming a light-emitting element by applying extensional strain to silicon. Moreover, Patent Literature 5 discloses a germanium laser diode using Purcell effect caused by strongly confining light in a germanium layer.

For technique for converting an indirect semiconductor to a direct-transition semiconductor in addition to the method of using extensional strain, a method called valley projection of using nanostructure of silicon is known. Since a region in which electrons spatially move around is limited in silicon in nanostructure, the momentum of the electron effectively decreases. In a substance such as silicon and germanium, a direction in which an electron has momentum depends upon proper band structure. The valley projection means a method of confining electrons in nanostructure in a direction in which the electron has momentum. As a result, the momentum of the electron is effectively turned zero. That is, the valley projection is a method of effectively turning a valley of energy in a conduction band a point $\Gamma$ and falsely converting to a state of direct transition. For example, since the bottom of a conduction band exists in the vicinity of a point X in band structure in bulk of silicon, a valley of energy can be effectively turned a point $\Gamma$ by making a (100) plane its surface and thinning the silicon and the silicon can be falsely converted to a direct-transition semiconductor. Besides, in the case of germanium, since the bottom of a conduction band is located at a point $L$ in bulk, a valley of energy can be effectively turned a point $\Gamma$ by forming a thin film having a (111) plane on its surface and the germanium can be falsely converted to a direct-transition semiconductor. Patent Literature 1 discloses an element that makes extremely thin monocrystalline silicon efficiently emit by directly connecting the extremely thin monocrystalline silicon having a (100) plane on its surface to an electrode and injecting carriers in a horizontal direction to a substrate.

In addition, Patent Literature 6 discloses double heterostructure of silicon and germanium that silicon is thinly laminated on germanium and current is made to flow in a direction of the thickness of the extremely thin silicon.

CITATION LIST

Patent Literature

Patent Literature 1: JP-A No. 2007-294628
Patent Literature 2: JP-A No. 2005-530360
Patent Literature 3: JP-A No. 2009-514231
Patent Literature 4: JP-A No. 2007-173590
Patent Literature 5: JP-A No. 2009-76498
Patent Literature 6: JP-A No. 2008-508702

Non-Patent Literature

Non-patent Literature 1: F. Zhang, V. H. Crespi, Physical Review Letters, 102, 2009, p. 156401
Non-patent Literature 2: X. Sun, J. Liu, L. C. Kimerling, J. Michel, Optics Letters, Vol. 34, No. 8, 2009, p. 1198

SUMMARY OF INVENTION

Technical Problem

As described above, for a light-emitting element for optical wiring in a silicon chip or optical wiring between chips, research is done to realize the conversion to a direct-transition semiconductor of germanium and the efficient injection of carriers into germanium. However, a laser which is made of these materials and which continuously oscillates at room temperature is not realized.

According to examination by the inventors, to realize a germanium laser diode by the injection of current, it is effective to efficiently confine carriers in a light emission layer. Besides, it is effective to efficiently inject carriers into the light emission layer and to reduce the loss of light.

In the germanium LED disclosed in Non-patent Literature 2 on a vertical type silicon substrate, since an electrode is provided on the upside and on the downside of the germanium light emission layer, a lap of light propagated in the light emission layer and the electrode is large and Non-patent Literature 2 has a problem that the loss of light is increased by free carrier absorption caused in the electrode.

For effective means for confining carriers in a light emission layer, double heterostructure in which an active layer and semiconductor layers different in band gap energy as a clad layer are connected is used in a compound semiconductor laser. At this time, electrons and holes can be easily confined in the active layer by designing so that for conduction band energy, the clad layer is larger than the active layer and for a valance band, the active layer is higher than the clad layer. Especially, the light-emitting element disclosed in Patent Literature 6 in which current is vertically injected into the thin silicon layer is effective.

Besides, to efficiently confine electrons in a germanium active layer, the inventors examined a germanium light-emitting element in which quantum confinement effect and tunnel effect did not have the relation of a trade-off to an electron confinement function by making current flow in a horizontal direction to a silicon thin film and injecting the current into the germanium light emission layer. However, when current is made to flow horizontally to the silicon thin film, it is feared that external resistance increases and threshold voltage for laser oscillation is raised.

Accordingly, a mechanism for confining carriers in the germanium light emission layer and the reduction of external resistance are required to be compatible.

An object of the present invention is to provide a light-emitting element in which electrons can be efficiently injected into a light emission layer made of a Group IV element and which can emit efficiently.

Solution to Problem

For one embodiment for achieving the object, there is provided a semiconductor optical element which is provided with an insulating layer, a barrier layer extended from a first region to a second region on the insulating layer and made of a single crystal including a first Group IV element, a first electrode connected to the barrier layer in the first region and having a first conductive type, a light-emitting part provided in the second region in contact with the barrier layer and made of a single crystal including a second Group IV element, and a second electrode connected to the light-emitting part and having a second conductive type, wherein the barrier layer has thickness in which quantum confinement effect manifests, and a distance from the first region to the second region is longer than a size in which tunnel effect manifests.

In addition, there is provided a semiconductor optical element including a substrate to which an insulating layer is provided, a barrier layer provided on the insulating layer, worked in a size in which quantum confinement effect manifests and made of a single crystal including a first Group IV element, a first electrode connected to one end of the barrier layer and having a first conductive type, a second electrode connected to the other end of the barrier layer and having a second conductive type, and a light-emitting part provided in contact with the barrier layer between the first and second electrodes and made of a single crystal including a second Group IV element, wherein current that flows between the first and second electrodes flows in a horizontal direction with respect to the substrate in at least a part of the barrier layer and light is emitted from the light-emitting part.

Further, there is provided a semiconductor optical element which is provided with an insulating layer, a first electrode provided on the insulating layer and having a first conductive type, a second electrode having a second conductive type, a semiconductor layer electrically connected to the first and second electrodes and made of a single crystal and a monocrystalline germanium light emission layer provided with the layer in contact with the semiconductor layer and has a characteristic that extensional strain is applied to the monocrystalline germanium light emission layer, current is injected into the germanium light emission layer from the first and second electrodes and light is generated.

Advantageous Effects of Invention

According to the present invention, the light-emitting element in which electrons can be efficiently injected into the light emission layer made of the Group IV element and which can emit efficiently can be provided.

DESCRIPTION OF EMBODIMENTS

First Embodiment

A light-emitting element equivalent to a first embodiment will be described referring to FIGS. 1A, 20A, 23A, 1B, 20B, 23B, 1C, 20C, 23C below. In this embodiment, a Fabry-Perot (FP) germanium laser diode produced by a simply formable method using a normal silicon process and its manufacturing method will be described.

Figure 20A:
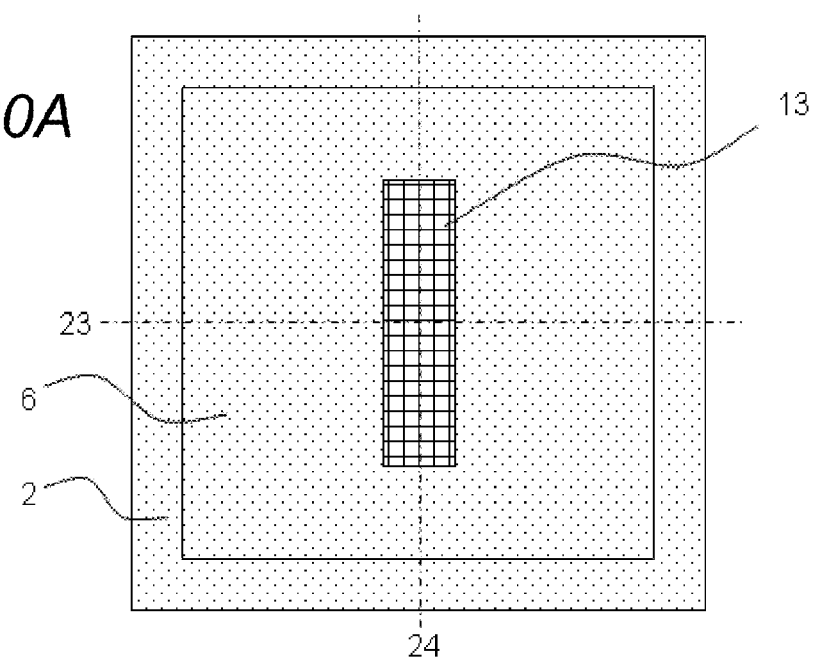
FIG. 20A is a schematic top view for explaining the manufacturing processes of the light-emitting elements in the first and seventh embodiments.
Figure 23A:
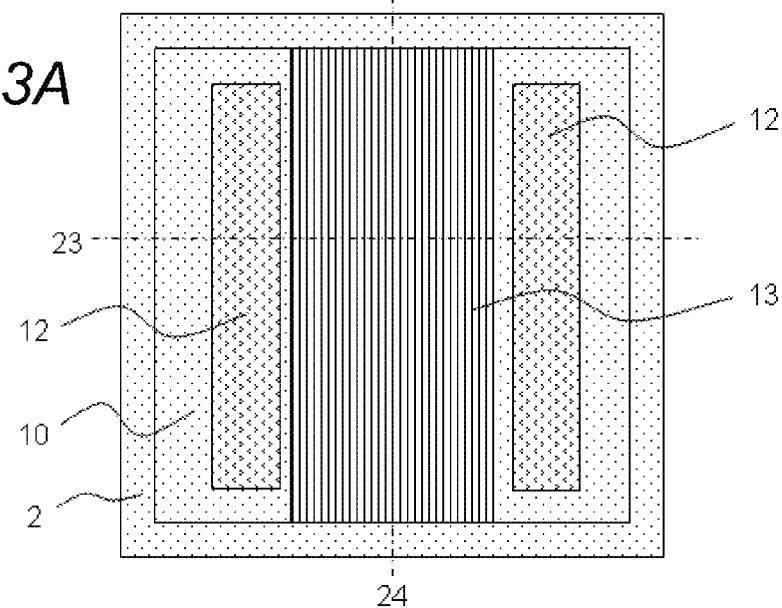
FIG. 23A is a schematic top view showing the light-emitting elements in the first, seventh, eighth and ninth embodiments.
Figure 23B:
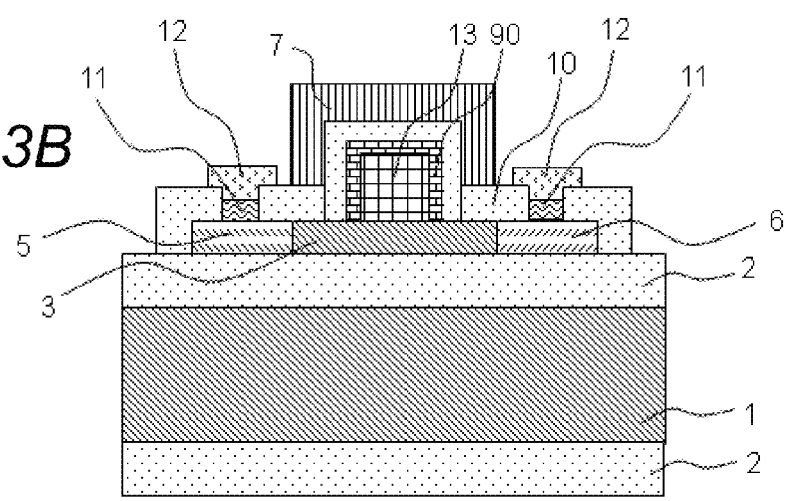
FIG. 23B is a sectional view showing the light-emitting element in the first embodiment.
Figure 23C:
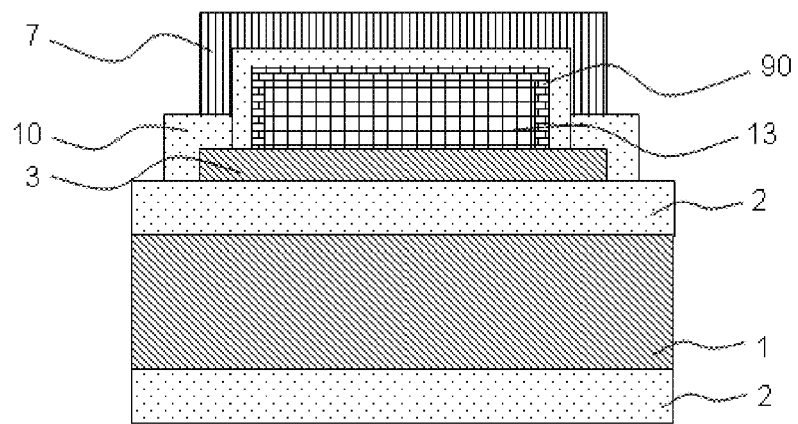
FIG. 23C is a sectional view showing the light-emitting elements in the first and seventh embodiments.

FIGS. 1A, 20B, 23B, 1B, 20C, 23C show sectional structures of the light-emitting element in the order of a manufacturing process. Besides, FIGS. 1C, 20A, 23A are schematic diagrams showing the light-emitting element viewed from the upside in the order of the manufacturing process. FIGS. 1A, 20B, 23B, 1B, 20C, 23C show the sectional structures when the light-emitting element is cut along a horizontal line 23 and a vertical line 24 respectively shown in FIGS. 1C, 20A, 23A. FIGS. 23A, 23B, 23C show a completed device in this embodiment.

The manufacturing process will be described in order below.

Figure 1A:
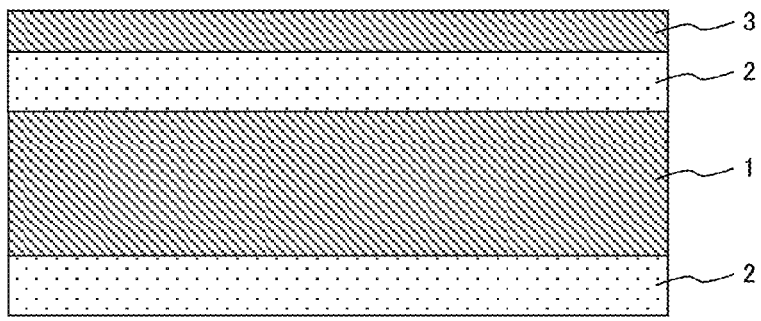
FIG. 1A is a sectional view for explaining manufacturing processes of light-emitting elements in each of first to fourth embodiments and sixth to ninth embodiments.
Figure 1B:
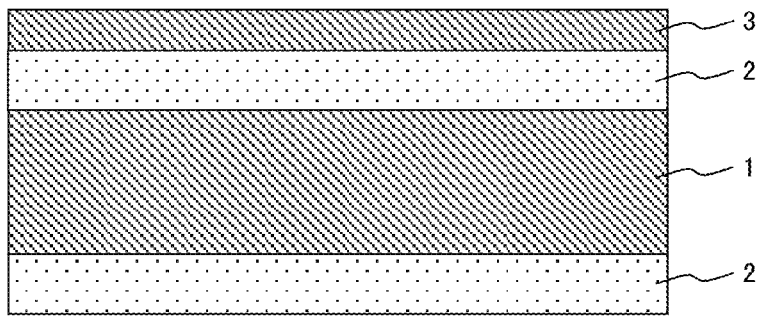
FIG. 1B is a sectional view for explaining the manufacturing processes of the light-emitting elements in each of first to the fourth embodiments and the sixth to ninth embodiments.
Figure 1C:
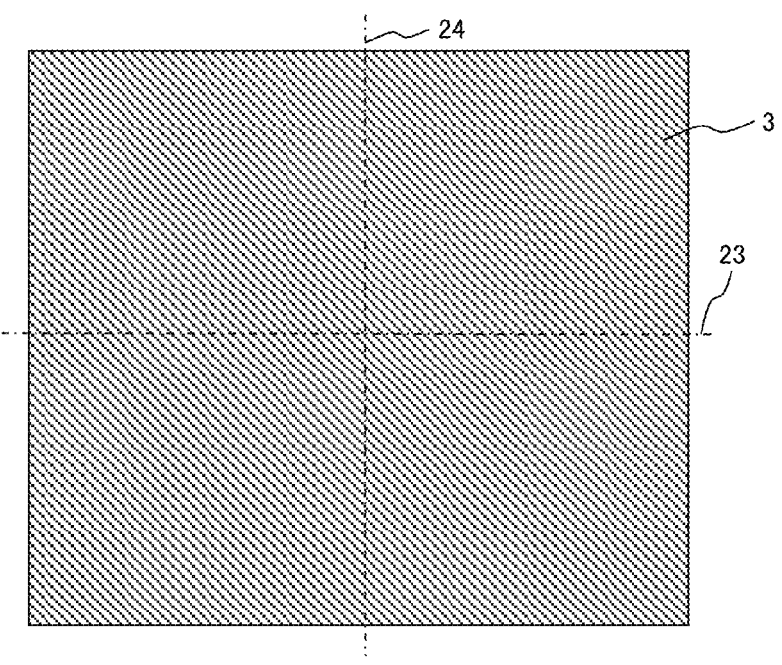
FIG. 1C is a schematic top view for explaining the manufacturing processes of the light-emitting elements in each of the first to fourth embodiments and the sixth to ninth embodiments.

First, as shown in FIGS. 1A, 1B, 1C, an SOI substrate in which a silicon substrate 1 for a support substrate, a silicon dioxide layer 2 for a buried oxide (BOX) film and a silicon-on-insulator (hereinafter, called SOI) layer 3 are laminated is prepared. The SOI layer 3 produced as a prototype in this embodiment has a (100) plane on its surface and initial thickness before the process is 70 nm. Besides, the thickness of the silicon dioxide layer 2 is 2000 nm. Although the SOI substrate is used in this embodiment, a silicon substrate may also be used for a support substrate.

As shown in FIG. 1B, a silicon dioxide (buried oxide (BOX)) layer 2 is also formed on the underside of the silicon substrate 1. This reason is to prevent a warp of a wafer of the silicon substrate 1. Since the silicon dioxide layer 2 having the thickness of 2000 nm is formed, strong compressive stress is applied to the silicon substrate 1 and the warp is reduced or prevented as the whole wafer by forming the layers having the same thickness on the surface and on the underside. The silicon dioxide layer 2 on the underside is also required to be minded not to be lost in the process. When the silicon dioxide layer 2 on the underside is lost in steps of cleaning and wet etching, the whole wafer warps, the wafer is not adsorbed by an electrostatic chuck, and it is feared that the following manufacturing process cannot be performed.

Next, after resist is applied, the SOI layer 3 is worked in a mesa shape by anisotropic dry etching after the resist is left in only a desired area by mask exposure by photolithography. The SOI layer is isolated in an insular (a mesa) shape by this step. Besides, in place of working the SOI layer 3 in a mesa shape as in this embodiment, the SOI layer may also be isolated by a step such as shallow trench isolation (STI) and local oxidation of Si (LOCOS).

Next, to protect a surface after cleaning, the surface of the SOI layer 3 is oxidized and a silicon dioxide layer having the thickness of approximately 30 nm is formed. The silicon dioxide layer not only reduces damage applied to the SOI layer 3 by ion implantation performed in the following step but prevents impurities from being emitted into the air by activation heat treatment. At this time, a silicon dioxide layer is also formed on the underside. The silicon dioxide layer is not necessarily required to be formed by a thermal oxidation process and a process for depositing only on the surface may also be used by using a device for chemical vapor deposition (CVD).

Next, impurities are implanted in a desired area of the SOI layer 3 by ion implantation. In the implantation of impurities, first, a p-type diffused layer electrode 5 is formed in the SOI layer 3 by implanting $BF_2$ ions by a dose of "$1\times10^{15}/cm^2$" after n resist is left in only the desired area by resist patterning using photolithography. Next, after the resist is removed, an n-type diffused layer 6 is formed in the SOI layer 3 by the implantation of P ions by a dose of "$1\times10^{15}/cm^2$" after resist is left in only a desired area by resist patterning using photolithography again. The p-type diffused layer 5 and the n-type diffused layer 6 function as an electrode for respectively injecting holes and electrons after the completion of the device. In this embodiment, an intrinsic semiconductor area in which no impurities are implanted is provided between the p-type diffused layer 5 and the n-type diffused layer 6. However, impurities may also be implanted so that the p-type diffused layer 5 and the n-type diffused layer 6 are directly connected without providing the intrinsic semiconductor area.

In this ion implantation step, since the SOI layer 3 in a part in which ions are implanted is made amorphous, the crystallinity is deteriorated. Then, it is important that only the surface of the SOI layer 3 is made amorphous and crystalline silicon is left in an area in which the SOI layer 3 is adjacent to the BOX layer 2 though it is not shown in the drawings. Since the whole SOI layer 3 in the area of ion implantation is made amorphous when acceleration voltage for ion implantation is set to be too high, there occurs a problem that the monocrystallinity is not recovered even if annealing is executed afterward and the SOI layer is made polycrystalline. In this embodiment, crystallinity can be recovered by activation heat treatment after ion implantation by performing ion implantation on a condition that only the surface of the SOI layer 3 is made amorphous because in an area adjacent to the BOX layer 2, a crystalline silicon layer is left. It is extremely important that monocrystallinity is fit for efficient emission.

Next, impurities is activated by annealing for 20 minutes in an atmosphere of nitrogen of 900° C. and simultaneously, the crystallinity of the SOI layer 3 is recovered.

Next, after a silicon dioxide layer 4 is deposited overall using the device for CVD, an opening is provided in the desired area of the silicon dioxide layer 4 by leaving resist in only a desired area by resist patterning using photolithography and applying anisotropic dry etching. The silicon dioxide layer 4 is not necessarily required to be formed by CVD and may also be formed by a thermal oxidation process. Besides, for a working method, wet etching may also be used.

Figure 20B:
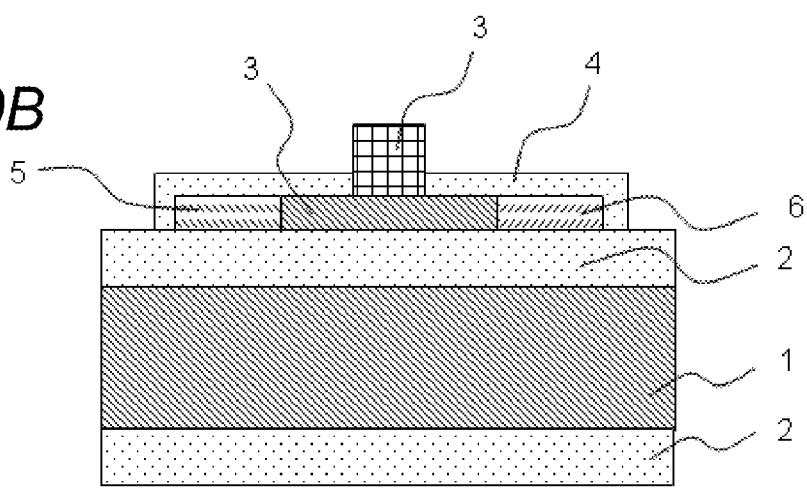
FIG. 20B is a sectional view for explaining the manufacturing process of the light-emitting element in the first embodiment.
Figure 20C:
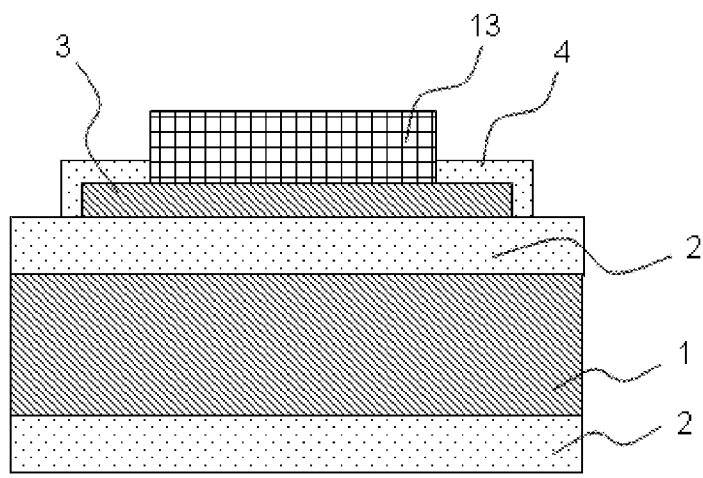
FIG. 20C is a sectional view for explaining the manufacturing process of the light-emitting element in the first embodiment.

Next, after a cleaning step, a germanium layer 13 acquired by selectively doping in an n type in only an area in which the surface of the SOI layer 3 is exposed is epitaxially grown up to the thickness of 200 nm and a state shown in FIGS. 20A, 20B, 20C is acquired. In this process of epitaxial growth, extensional strain is applied to the germanium layer 13 because of difference in a coefficient of thermal expansion between the germanium layer and the silicon substrate 1. In the drawings shown in this embodiment, the germanium light emission layer 13 is epitaxially grown so that it is connected to the intrinsic semiconductor area in which no impurities are implanted. However, an opening may be provided and the germanium light emission layer 13 may be epitaxially grown so that the germanium light emission layer is connected to the p-type diffused layer 5 or the n-type diffused layer 6 or both.

Besides, since the germanium layer 13 should function not only as a light emission layer but as an optical confinement layer after the completion of the device, the germanium layer 13 is designed to be a linear optical resonator in this embodiment.

Figure 21:
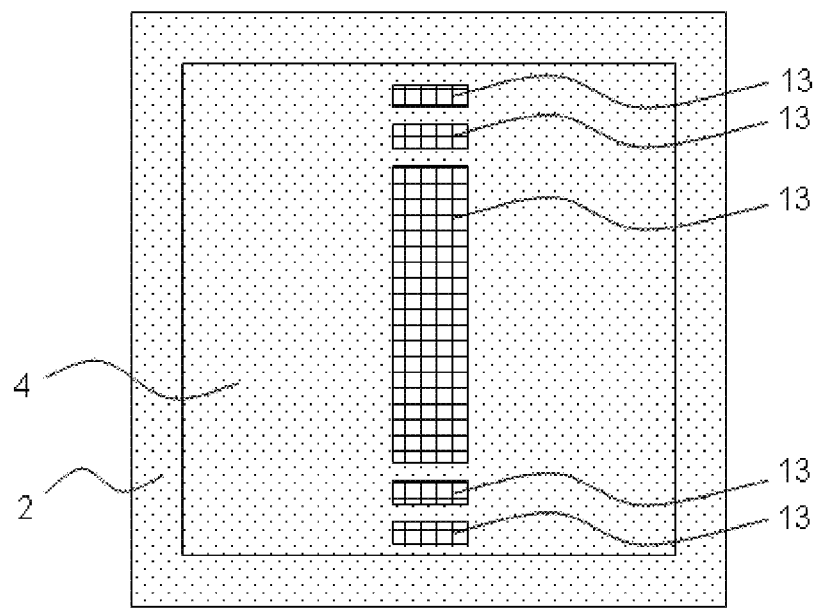
FIG. 21 is a schematic top view for explaining a manufacturing process of another light-emitting element in the first embodiment.

In addition, as shown in FIG. 21, a mirror of a distributed Bragg reflector (DBR) type is formed by arranging a small piece made of germanium or amorphous silicon in the vicinities of both ends in a longitudinal direction of the germanium light emission layer 13 linearly worked at a periodic interval and a DBR germanium laser diode can also be produced. The DBR mirror is a dielectric mirror configured based upon difference in a refractive index with a surrounding insulated film and high reflectance of 99.90 or more can be achieved. Since the abovementioned mirror having high reflectance can be simply formed by a silicon process, laser oscillation can be achieved even if emission from germanium is feeble. In the design of the DBR mirror, the width and an interval of each small piece made of amorphous silicon are important parameters and are designed so that they are integral times of approximately a half of an emission wavelength in a medium.

Figure 22:
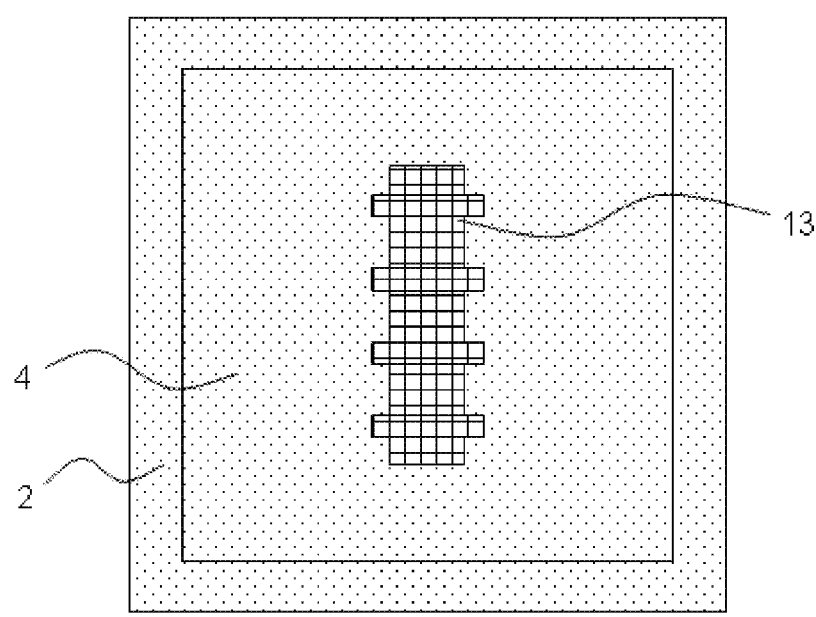
FIG. 22 is a schematic top view for explaining a manufacturing process of further another light-emitting element in the first embodiment.

Moreover, as shown in FIG. 22, a distributed feed-back (DFB) laser in which the germanium layer 13 functions not only as a light emission layer but as an optical confinement layer where the periodic variation of a refractive index can be applied to propagated light after the completion of the device can also be produced by designing so that the width of the germanium layer 13 periodically varies. Besides, a ring type laser in which the germanium layer 13 functions not only as a light emission layer but as a ring type optical confinement layer which is free of loss by reflection on an end face of an optical waveguide after the completion of the device can also be produced by designing the germanium layer 13 in the shape of a ring though it is not described in this embodiment.

Next, a germanium dioxide layer 90 is formed on a surface of the germanium light emission layer 13 by thermal oxidation and its surface is passivated. Since interface level density of the germanium light emission layer 13 and the germanium dioxide layer 90 is small, non-radiative recombination of a carrier caused on the surface of the germanium light emission layer 13 is inhibited and light emission efficiency can be enhanced.

Next, after a silicon dioxide layer 10 is deposited by CVD and others, resist is left in only a desired area by resist patterning using photolithography and the silicon dioxide layer in a desired area is removed by wet etching using hydrofluoric acid. For a working method, anisotropic dry etching may also be used. Next, after a TiN layer and an Al layer are deposited overall, resist is left in only a desired area by resist patterning using photolithography, the TiN layer is worked by wet etching after the Al layer is worked by wet etching, and as a result, a TiN electrode 11 and an Al electrode 12 are formed. For a working method, anisotropic dry etching may also be used.

Next, after a silicon nitride layer 7 is deposited by CVD and others, resist is left in only a desired area by resist patterning using photolithography and the silicon nitride layer is worked by anisotropic dry etching. The silicon nitride layer 7 has a role for applying extensional strain to the germanium light emission layer 13 and extensional strain can be efficiently applied to the germanium light emission layer 13 by providing the silicon nitride layer in the vicinity of the germanium light emission layer 13. In the germanium light emission layer 13 to which extensional strain is applied, the difference in energy between a point Γ and a point L in a conduction band is reduced, and therefore light emission efficiency can be enhanced compared with strainless germanium. Besides, since strong local strain is applied to a worked end of the silicon nitride layer 7, extensional strain can be efficiently applied to the germanium light emission layer 13 by providing the end of the silicon nitride layer 7 in the vicinity of the germanium light emission layer 13. At this time, since reverse direction-oriented strain inside and outside the silicon nitride layer 7 is applied to a circumference of the end of the silicon nitride layer 7, extensional strain can be applied inside or outside the end of the silicon nitride layer 7 even if a membrane stress direction which the silicon nitride layer 7 has is extension and compression. Next, a state shown in FIGS. 23A, 23B, 23C is acquired by performing hydrogen annealing and executing processing for hydrogen-terminating a defect caused in the process and the device is completed.

Referring to FIG. 23B, the device produced as described above, that is, the configuration and operating characteristics of the germanium laser will be described below.

The germanium light emission layer 13 is electrically connected to the p-type diffused layer electrode 5 and the n-type diffused layer electrode 6. The germanium light emission layer 13 is linearly worked and also functions as a Fabry-Perot optical resonator.

Carriers are injected into the germanium light emission layer 13 at high density by making current flow between the p-type diffused layer electrode 5 and the n-type diffused layer electrode 6 in a forward direction, an electron and a hole are recombined, and emission is made. Emitted light is strongly confined in the germanium light emission layer 13, when current that exceeds a threshold is made to flow, induced emission is caused, and a laser beam is oscillated. Extensional strain is applied to the light emission layer and an oscillation wavelength is approximately 1600 nm which is a designed wavelength. Since a laser beam is emitted in parallel to the silicon substrate 1, it is validated that the device is optimum for an application such as on-chip optical wiring.

In FIGS. 23A, 23B, 23C, the steps before a wiring step and the structures are shown. However, when an optical integrated circuit is formed, desired wiring has only to be made afterward. Besides, when an electronic circuit is also mounted, some of the abovementioned steps can be performed at the same time as steps for forming a transistor. When the optical device is produced in the normal silicon process as described above, coexistence with the electronic device is easy. Especially, since the germanium laser diode according to the present invention can oscillate in the vicinity of 1550 nm at which the transmission loss of an optical fiber is small, it is clarified that the reliable and low-priced laser can be provided, utilizing conventional type infrastructure for optical communication as it is.

According to this embodiment, electrons can be efficiently injected into the light emission layer made of the Group IV element and the light-emitting element (the Fabry-Perot laser diode) which can emit very efficiently can be provided.

Second Embodiment

The inventors found that the following problem was required to be settled to enhance light emission efficiency further than that in the configuration in the first embodiment.

In comparison between silicon and germanium which are respectively semiconductor material having high consistency with a silicon line, germanium has larger conduction band energy and larger valence band energy than silicon. When germanium is utilized for an active layer, holes can be confined. However, it is difficult to confine electrons in an active layer.

That is, although, in bulk, the conduction band energy of silicon is smaller than that of germanium, band gap energy of silicon increases by quantum confinement effect by working in a scale of a nanometer. However, as disclosed in Patent Literature 6, in a case that a film is thinned to increase quantum confinement effect when current is made to flow perpendicularly to a thin film, the tunneling probability of an electron increases according to thinning and it is estimated that it is difficult to effectively confine carriers. That is, there is a problem that as to a function for confining electrons as a barrier layer, the quantum confinement effect and tunnel effect are in the relation of a trade-off.

Accordingly, to efficiently confine electrons in a germanium active layer, it is necessary to realize a monocrystalline silicon barrier layer in a nanometer size in which quantum confinement effect and tunnel effect are not in the relation of a trade-off for an electron confinement function.

As for the problem, the inventors examined such configuration that quantum confinement effect and tunnel effect were not in the relation of a trade-off and realized that current had only to be made to flow not in a direction of the thickness (a vertical direction) of a barrier layer worked in a size to an extent that quantum confinement effect manifested and made of a monocrystalline Group IV element but in a direction of a surface (a horizontal direction) of the layer. That is, a light-emitting element using the Group IV element in this embodiment is formed on an insulator, an electrode for injecting holes and a light emission layer are electrically connected via a barrier layer made of the Group IV element such as monocrystalline silicon and germanium and worked in a size to an extent that quantum confinement effect manifests, the electrode for injecting holes and the light emission layer are electrically connected by making current flow in the barrier layer in a horizontal direction with a substrate, and the length of a current path in the barrier layer can be arbitrarily changed. That is, the length of the current path can be extended to an extent that no tunnel effect occurs by making current flow in the horizontal direction in the barrier layer and the probability based upon a distance of the penetration of a particle by tunnel effect exponentially decreases. A range on which tunnel effect has an effect is approximately 0.1 to 10 nm though the range also depends upon the size of a potential barrier. In this case, a size to an extent that tunnel effect manifests is called a size in which tunnel effect manifests. For an element used for the light emission layer, although germanium is practical and for an element used for the barrier layer, silicon and germanium are practical, another Group IV element can also be used. It is desirable that when a monocrystalline silicon layer is used for the barrier layer, its surface is a (111) plane and in the case of a monocrystalline germanium layer, its surface is a (100) plane. In this case, the tunnel effect means a phenomenon that a particle penetrates a potential barrier by the exudation in a wave function of the particle because a probability that the particle may penetrate the potential barrier exists even if the potential barrier (a conduction band of the barrier layer) larger than energy which the particle (an electron) has exists.

In the light-emitting element such as a germanium laser diode in this embodiment, the electrode for injecting holes and the light emission layer are connected via the barrier layer (in this case, the thickness of the worked barrier layer is called thickness in which quantum confinement effect manifests) made of monocrystalline silicon or monocrystalline germanium and worked to an extent (0.1~10 nm) that quantum confinement effect manifests, electrons can be efficiently confined in the light emission layer by making current flow in the horizontal direction with the substrate in the barrier layer, and the germanium laser diode in which threshold current is low can be produced. In this case, the quantum confinement effect means a phenomenon that an energy gap varies because the momentum of a particle (an electron) is limited when the particle (the electron) is confined in structure in a size of a nanometer. The light-emitting element equivalent to the second embodiment will be described, referring to FIGS. 1A to 5A, FIGS. 1B to 5B, FIGS. 1C to 5C below. In this embodiment, a Fabry-Perot (FP) germanium laser diode produced by a method of enabling easily forming it using a normal silicon process and its manufacturing method will be described.

FIGS. 1A to 5A and FIGS. 1B to 5B show sectional structures of the light-emitting element in the order of a manufacturing process. Besides, FIGS. 1C to 5C are schematic diagrams showing the light-emitting element viewed from the upside in the order of the manufacturing process. FIGS. 1A to 5A and FIGS. 1B to 5B show the sectional structures respectively cut along each horizontal line 23 and each vertical line 24 shown in FIGS. 1C to 5C. Drawings showing the completed device are FIGS. 5A, 5B, 5C in this embodiment.

The manufacturing process will be sequentially described below.

First, as shown in FIGS. 1A, 1B, 1C, an SOI substrate in which a silicon substrate 1 for a support substrate, a silicon dioxide layer 2 for a buried oxide (BOX) film and a silicon-on-insulator (hereinafter, called SOI) layer 3 are laminated is prepared. The SOI layer 3 produced as a prototype in this embodiment has the (111) plane on its surface and initial thickness before the process is 70 nm. Besides, the thickness of the silicon dioxide layer 2 is 2000 nm.

As shown in FIG. 1A, a silicon dioxide (a buried oxide (BOX) layer 2 is also formed on the underside of the silicon substrate 1. This reason is to prevent a warp of a wafer of the silicon substrate 1. Since the silicon dioxide layer 2 having the thickness of 2000 nm is formed, strong compressive stress is applied to the silicon substrate 1 and a warp of the whole wafer is reduced or prevented because the silicon dioxide layer is formed by the same thickness on the surface and on the underside of the substrate. The silicon dioxide layer 2 on the underside is also required to be minded not to be lost in the process. When the silicon dioxide layer 2 on the underside is lost in steps of cleaning and wet etching, the whole wafer is warped, the wafer is not adsorbed by an electrostatic chuck, and it is feared that the following manufacturing process cannot be executed.

Figure 2A:
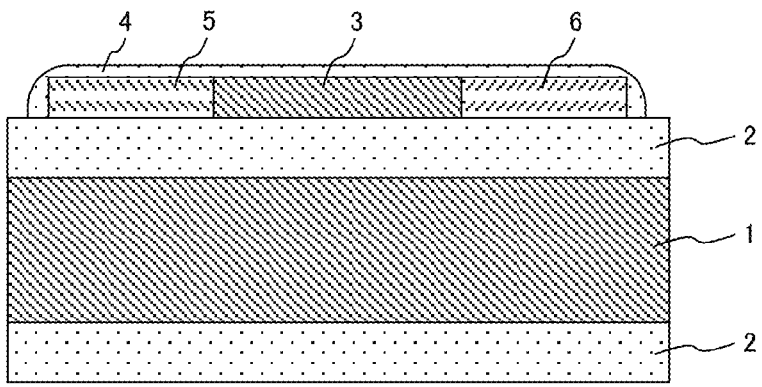
FIG. 2A is a sectional view for explaining the manufacturing processes of the light-emitting elements in the second and fourth embodiments.
Figure 2B:
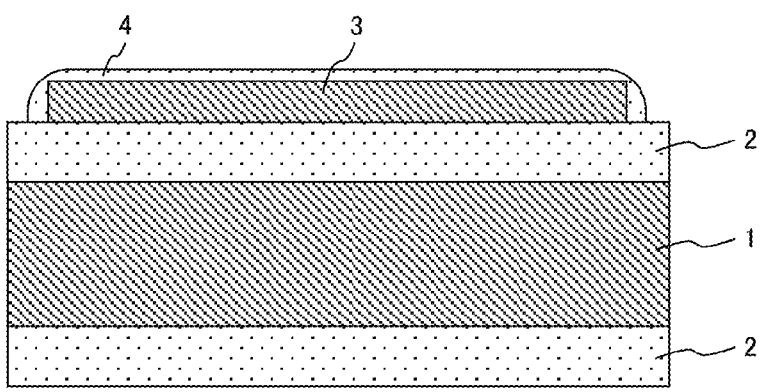
FIG. 2B is a sectional view for explaining the manufacturing processes of the light-emitting elements in the second and fourth embodiments.
Figure 2C:
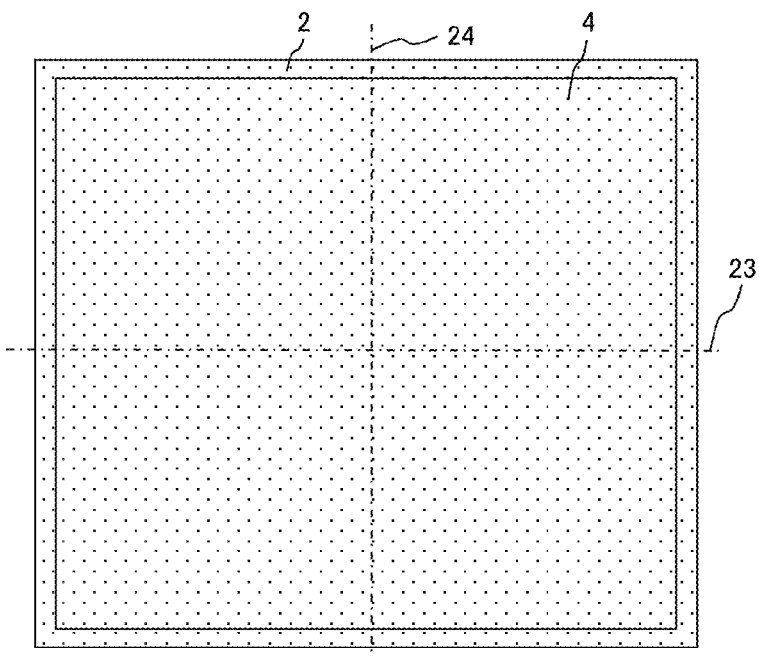
FIG. 2C is a schematic top view for explaining the manufacturing processes of the light-emitting elements in the second and fourth embodiments.

Next, after resist is applied, the SOI layer 3 is worked in a mesa shape by anisotropic dry etching after the resist is left in only a desired area by mask exposure by photolithography. In FIGS. 2A, 2B, 2C, only an area in which one element is formed is shown to simplify the drawings. However, it need scarcely be said that many elements are simultaneously formed on the substrate. Since the silicon process is used, many elements can be integrated at a high yield. In this step, the SOI layer is isolated in an insular (a mesa) shape. Besides, in place of working the SOI layer 3 in a mesa shape as in this embodiment, the SOI layer may also be isolated by a step such as shallow trench isolation (STI) and local oxidation of Si (LOCOS).

Next, after a cleaning step, a silicon dioxide layer 4 having the thickness of approximately 30 nm is formed by oxidizing a surface of the SOI layer 3 to protect the surface. The silicon dioxide layer 4 not only reduces damage applied to the SOI layer 3 by ion implantation performed in the following process but prevents impurities from being emitted into the air by activating thermal treatment. At this time, a silicon dioxide layer 4 is also formed on the underside. The silicon dioxide layer 4 is not necessarily required to be formed by a thermal oxidation process and a process for depositing only on a surface using a device for chemical vapor deposition (CVD) and others may also be used.

Next, impurities are implanted in a desired area of the SOI layer 3 by ion implantation. In the implantation of impurities, first, a p-type diffused layer electrode 5 is formed in the SOI layer 3 by implanting $BF_2$ ions by the dose of "$1 \times 10^{15}/cm^2$" after n resist is left in only a desired area by resist patterning using photolithography. Next, after the resist is removed, an n-type diffused layer 6 is formed in the SOI layer 3 by implanting P ions by the dose of "$1 \times 10^{15}/cm^2$" after resist is left in only a desired area by resist patterning using photolithography again. The p-type diffused layer 5 and the n-type diffused layer 6 function as an electrode for respectively injecting holes and electrons after the device is completed.

In this ion implantation step, since the SOI layer 3 in a part in which ions are implanted is made amorphous, the crystallinity is deteriorated. Then, it is important that only the surface of the SOI layer 3 is made amorphous and crystalline silicon is left in an area in which the SOI layer 3 is adjacent to the BOX layer 2 though it is not shown in the drawings. Since the whole SOI layer 3 in the area in which ions are implanted is made amorphous when accelerating voltage for ion implantation is set to too high voltage, monocrystallinity is not recovered even if annealing is applied afterward and there occurs a problem that the whole SOI layer is made polycrystalline. In this embodiment, since the crystalline silicon layer is left in the area in which the SOI layer is adjacent to the BOX layer 2 by implanting ions on a condition that only the surface of the SOI layer 3 is made amorphous, crystallinity can be recovered by activating thermal treatment and others after ion implantation. It is extremely important that monocrystallinity is fit for efficient emission.

Next, a state shown in FIGS. 2A, 2B, 2C is acquired by activating impurities by annealing in an atmosphere of nitrogen of 900° C. for 20 minutes and simultaneously, recovering the crystallinity of the SOI layer 3.

Figure 3A:
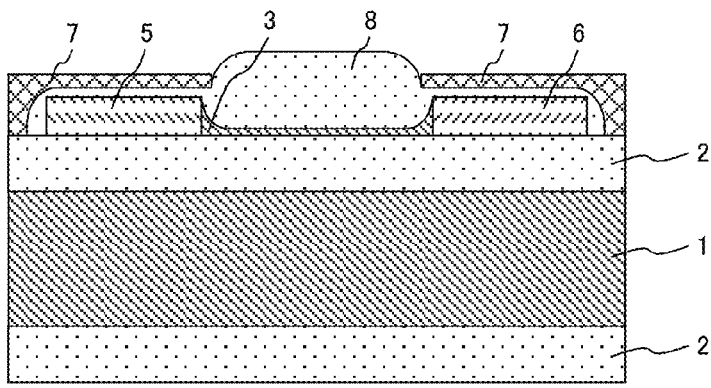
FIG. 3A is a sectional view for explaining the manufacturing processes of the light-emitting elements in the second and fourth embodiments.
Figure 3B:
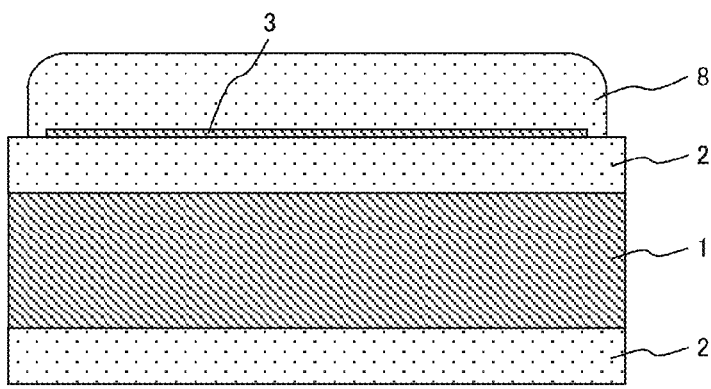
FIG. 3B is a sectional view for explaining the manufacturing processes of the light-emitting elements in the second and fourth embodiments.
Figure 3C:
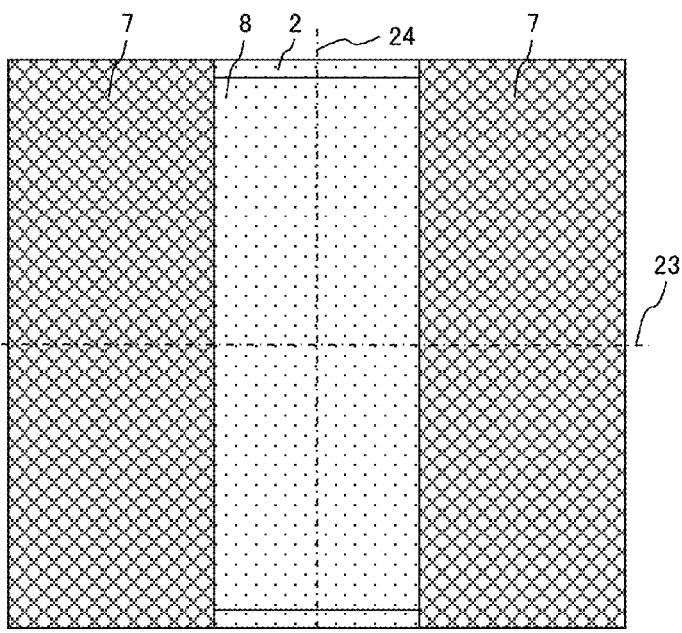
FIG. 3C is a schematic top view for explaining the manufacturing processes of the light-emitting elements in the second and fourth embodiments.

Next, after a silicon nitride layer 7 is deposited overall using a device for CVD and others, resist is left in only a desired area by resist patterning using photolithography and an opening is provided to a desired area of the silicon nitride layer 7 by anisotropic dry etching. Next, after a cleaning step, a silicon dioxide layer 8 is finally formed by alternatively performing the formation of a silicon dioxide layer by oxidation and the wet etching of the silicon dioxide layer using hydrofluoric acid, the SOI layer 3 in the opening is thinned so that the thickness is locally 3 nm, and a state shown in FIGS. 3A, 3B, 3C is acquired. At this time, the SOI layer 3 locally thinned has thickness to an extent that quantum confinement effect manifests and band gap energy increases, compared with silicon in bulk. The thickness of the SOI layer 3 as a barrier layer may have a finite value of 10 nm or less, though 4 nm or less is practical.

In this embodiment, a function of efficiently confining electrons is given to a germanium layer 9 by connecting the p-type diffused layer 5 and the germanium layer 9 which is formed later and which is a light emission layer via the thinned SOI layer 3. Besides, since the surface of the thinned SOI layer 3 has the (111) plane, emission from the thin silicon barrier layer can be inhibited after the completion of the device.

Next, after the silicon nitride layer 7 is removed by wet etching using heated phosphoric acid and cleaning, resist is left in only a desired area by resist patterning using photolithography, the silicon dioxide layer in a desired area is removed by wet etching using hydrofluoric acid, and a part of the surface of the thinned SOI layer 3 is exposed. For a working method, anisotropic dry etching may also be used.

Only silicon atoms included in silicon germanium are selectively oxidized by performing a step for oxidation after the silicon germanium is selectively epitaxially grown in only an area where the surface of the thinned SOI layer 3 is exposed though it is not shown in the drawings for this embodiment, and germanium can be locally formed on the BOX layer 2. Since the germanium layer 9 can be epitaxially grown on a germanium layer when the germanium layer 9 is epitaxially grown later if the germanium is formed on the BOX layer 2 as described above, strain caused by grid unconformity on the germanium layer 9 can be prevented.

Figure 4A:
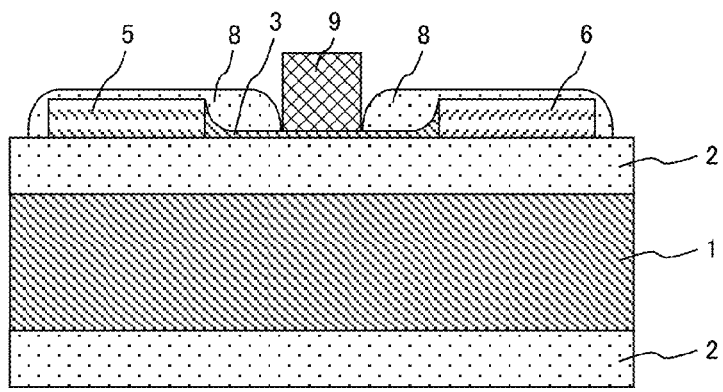
FIG. 4A is a sectional view for explaining the manufacturing process of the light-emitting element in the second embodiment.
Figure 4B:
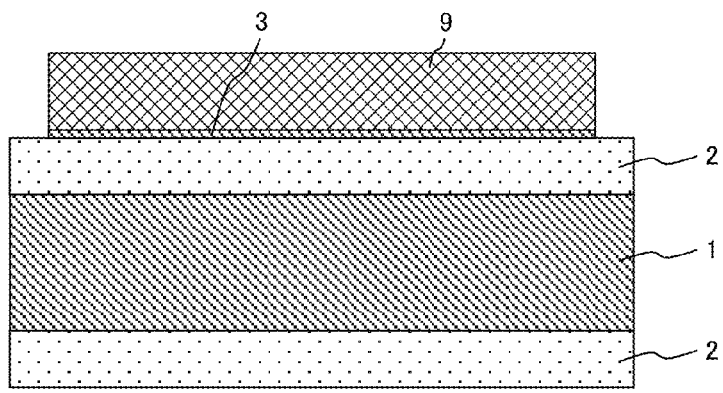
FIG. 4B is a sectional view for explaining the manufacturing process of the light-emitting element in the second embodiment.
Figure 4C:
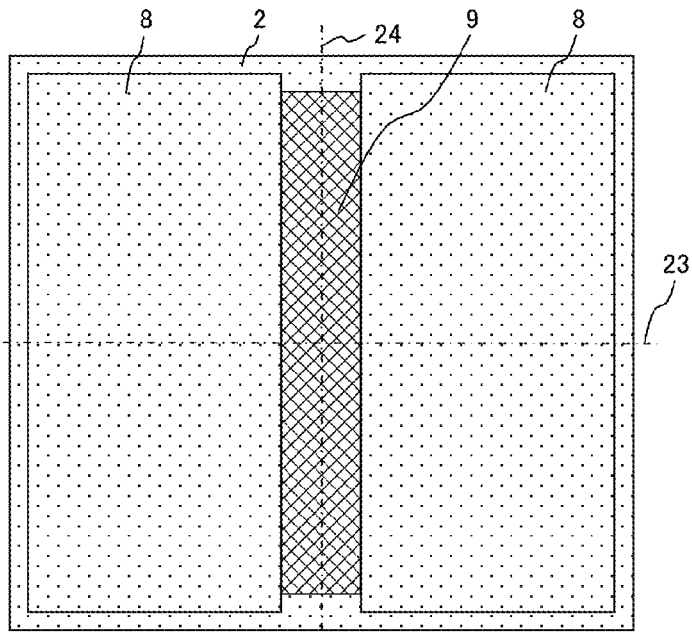
FIG. 4C is a schematic top view for explaining the manufacturing process of the light-emitting element in the second embodiment.

Next, after a cleaning step, the germanium layer 9 selectively doped in an N-type in only the area where the surface of the thinned SOI layer 3 is exposed is epitaxially grown to be the thickness of 200 nm and a state shown in FIGS. 4A, 4B, 4C is acquired. The SIO layer 3 between the germanium layer 9 and the p-type diffused layer electrode 5 has length that exceeds a size in which tunnel effect manifests. In this process of epitaxial growth, extensional strain is applied to the germanium layer 9 by difference in a coefficient of thermal expansion between the germanium layer and the SOI layer 3 on the underside. Besides, since the germanium layer 9 functions not only as a light emission layer after the completion of the device but as an optical confinement layer, the germanium layer 9 is desired to be a linear optical resonator in this embodiment.

Besides, though the following is not shown in the drawings for this embodiment, a distributed feed-back (DFB) laser where the germanium layer 9 functions not only as a light emission layer after the completion of the device but as an optical confinement layer in which the periodic variation of a refractive index can be applied to propagated light can also be produced by designing the germanium layer 9 to be plural pieces periodically arranged. In addition, though the following is not shown in the drawings for this embodiment, a ring type laser where the germanium layer 9 functions not only as a light emission layer after the completion of the device but as a ring type optical confinement layer which is free of loss by reflection on an end face of an optical waveguide can also be produced by designing the germanium layer 9 in a ring type.

Next, after a silicon dioxide layer 10 is deposited by CVD and others, resist is left in only a desired area by resist patterning using photolithography and the silicon dioxide layer in a desired area is removed by wet etching using hydrofluoric acid. For a working method, anisotropic dry etching may also be used. Next, after a TiN layer and an Al layer are deposited overall, resist is left in only a desired area by resist patterning using photolithography, after the Al layer is worked by wet etching, the TiN layer is worked by wet etching, and as a result, a TiN electrode 11 and an Al electrode 12 are formed. For a working method, anisotropic dry etching may also be used.

Figure 5A:
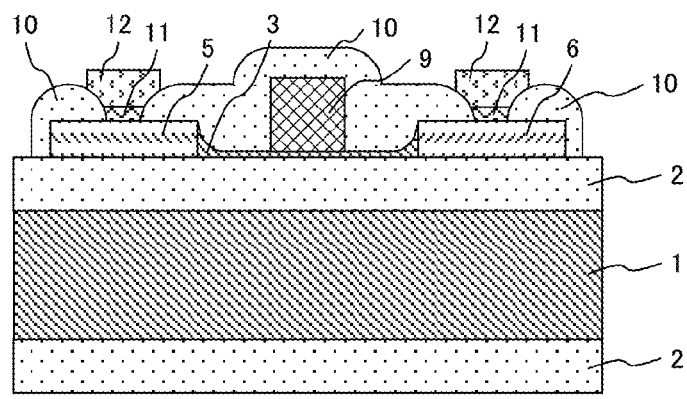
FIG. 5A is a sectional view for explaining the manufacturing process of the light-emitting element in the second embodiment.
Figure 5B:
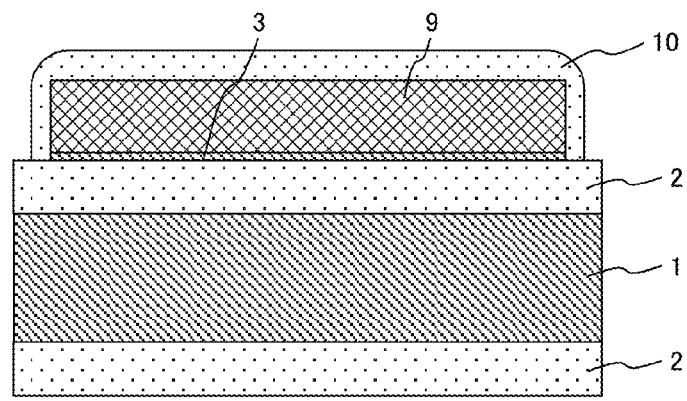
FIG. 5B is a sectional view for explaining the manufacturing process of the light-emitting element in the second embodiment.
Figure 5C:
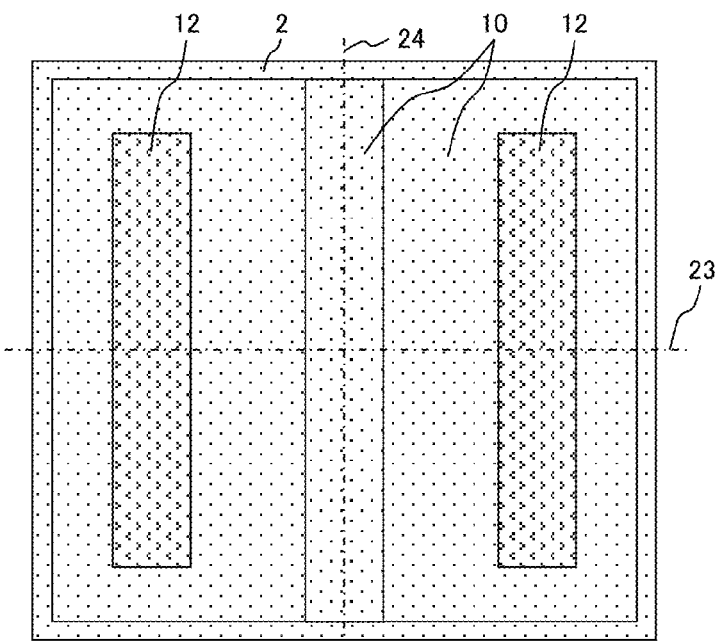
FIG. 5C is a schematic top view for explaining the manufacturing process of the light-emitting element in the second embodiment.

Next, the device is completed by performing hydrogen annealing and executing processing for hydrogen-terminating a defect caused in the process as shown in FIGS. 5A, 5B, 5C.

Referring to FIG. 5A, the configuration and operating characteristic of the device produced as described above, that is, the germanium laser will be described below.

The germanium light emission layer 9 is electrically connected to the p-type diffused layer electrode 5 and the n-type diffused layer electrode 6 via the thinned SOI layer 3. At this time, band gap energy of the thinned SOI layer 3 increases by quantum confinement effect and the SOI layer functions as a barrier layer that efficiently confines electrons and holes in germanium. The germanium light emission layer 9 is linearly worked and also functions as a Fabry-Perot optical resonator.

Besides, though the following is not shown in the drawings for this embodiment, a mirror of a distributed Bragg reflector (DBR) type is formed by arranging pieces made of amorphous silicon in the vicinities of both ends in a longitudinal direction of the germanium light emission layer 9 linearly worked at a periodic interval and a DBR germanium laser diode can also be produced. The DBR mirror is a dielectric mirror configured based upon difference in a refractive index with a circumferential insulating film and can achieve high reflectance of 99.90 or more. Since such a mirror of high reflectance can be simply formed by a silicon process, laser oscillation can be achieved even if emission from germanium is feeble. In the design of the DBR mirror, the width and an interval of each piece made of amorphous silicon are important parameters and they are designed so that they are integral times of approximately a half of an emission wavelength in a medium.

Carriers are injected into the germanium light emission layer 9 at high density by making forward current flow between the p-type diffused layer electrode 5 and the n-type diffused layer electrode 6, an electrode and a hole are recombined, and emission is made. Emitted light is strongly confined in the germanium light emission layer 9, when current that exceeds a threshold is made to flow, induced emission is caused, and a laser beam is oscillated. Extensional strain is applied to the light emission layer and an oscillation wavelength is approximately 1600 nm which is a designed wavelength. Since a laser beam is emitted in parallel to the silicon substrate 1, it is also validated that the device is optimum for an application such as on-chip optical wiring.

In FIGS. 5A, 5B, 5C, the steps before a wiring step and the structures are shown. However, when an optical integrated circuit is formed, a desired wiring step has only to be performed afterward. Besides, when an electronic circuit is also mounted, some of the abovementioned steps can be performed at the same time as steps for forming a transistor. When the optical device is produced in a normal silicon process as described above, coexistence with an electronic device is easy. Especially, since the germanium laser diode according to the present invention can oscillate in the vicinity of 1550 nm at which the transmission loss of an optical fiber is small, it is clarified that the reliable and low-priced laser can be provided utilizing conventional type infrastructure for optical communication as it is.

According to this embodiment, the light-emitting element (the Fabry-Perot laser diode) in which electrons can be efficiently injected into the light emission layer made of the Group IV element and which can efficiently emit light can be provided.

Third Embodiment

A third embodiment will be described referring to FIGS. 1A, 6A to 9A, 2B, 6B to 9B, 1C, 6C to 9C below. The items described in the second embodiment and undescribed in this embodiment can also be applied to this embodiment unless there are special circumstances. In this embodiment, a low-resistance Fabry-Perot (FP) germanium laser diode which is produced by a method that enables easy formation using a normal silicon process and its manufacturing method will be described.

Figure 8A:
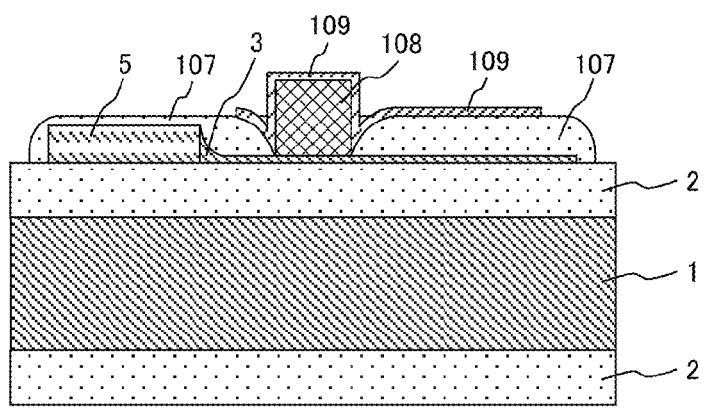
FIG. 8A is a sectional view for explaining the manufacturing process of the light-emitting element in the third embodiment.
Figure 8B:
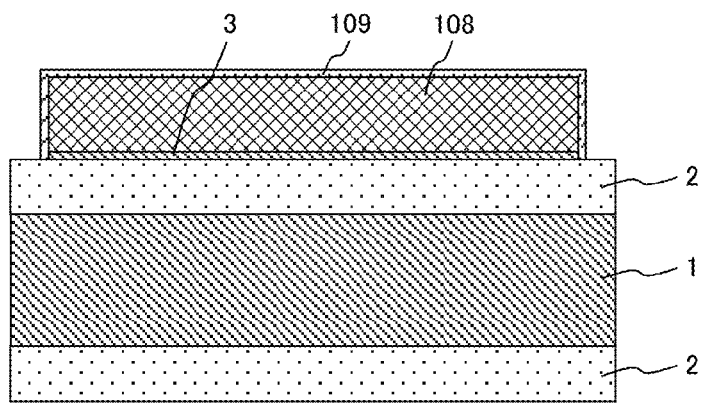
FIG. 8B is a sectional view for explaining the manufacturing process of the light-emitting element in the third embodiment.
Figure 8C:
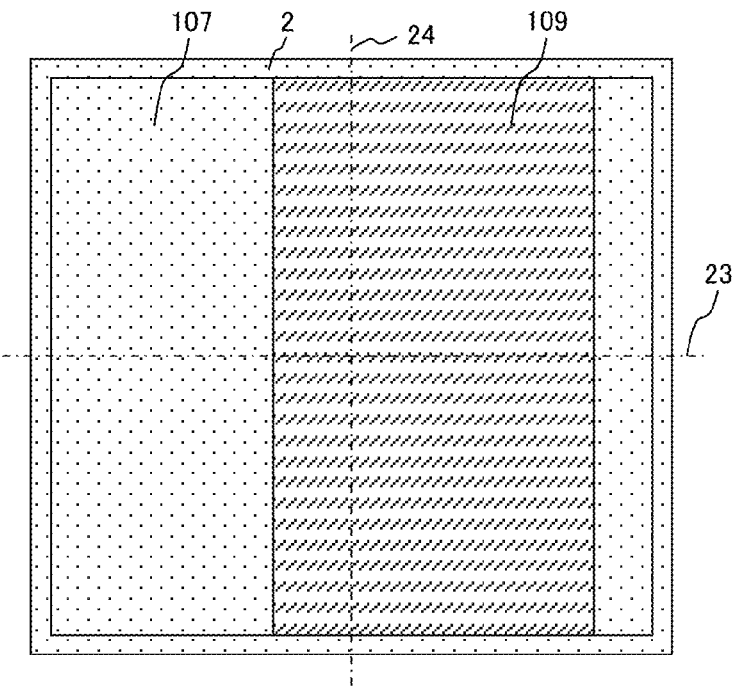
FIG. 8C is a schematic top view for explaining the manufacturing process of the light-emitting element in the third embodiment.
Figure 9A:
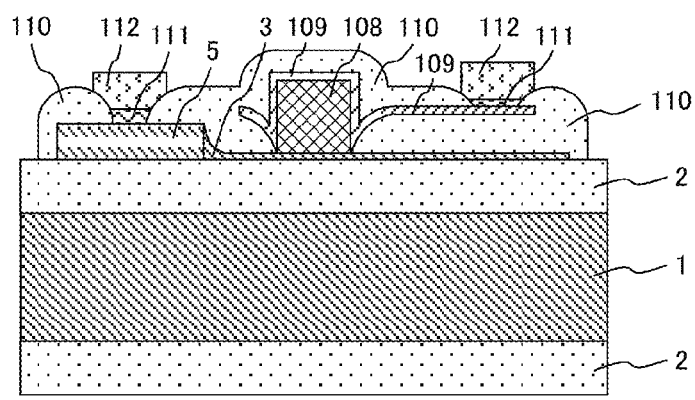
FIG. 9A is a sectional view for explaining the manufacturing process of the light-emitting element in the third embodiment.
Figure 9B:
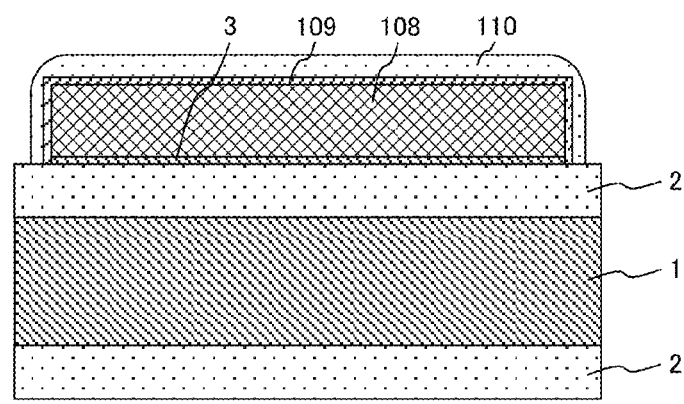
FIG. 9B is a sectional view for explaining the manufacturing process of the light-emitting element in the third embodiment.

FIGS. 1A, 6A to 9A, 1B, 6B to 9B show sectional structures of the light-emitting element in the order of the manufacturing process. Besides, FIGS. 1C, 6C to 9C show are schematic diagrams showing the light-emitting element viewed from the upside in the order of the manufacturing process. In this case, FIGS. 6A to 9A and FIGS. 6B to 9B show the sectional structures when the light-emitting element is respectively cut along each horizontal line 23 and each vertical line 24 in FIGS. 6C to 9C. FIGS. 9A, 9B, 9C show the completed device in this embodiment.

The manufacturing process will be described in order below.

The manufacturing process in FIGS. 1A, 1B, 1C is omitted because it is the same as that in the second embodiment.

After resist is applied from a state shown in FIGS. 1A, 1B, 1C, the SOI layer 3 is worked in a mesa shape by anisotropic dry etching after the resist is left in only a desired area by mask exposure by photolithography. Next, after a cleaning step, a surface of the SOI layer 3 is oxidized to protect the surface and as a result, a silicon dioxide layer 4 having the thickness of approximately 30 nm is formed. The silicon dioxide layer 4 not only reduces damage which is applied to the SOI layer 3 by ion implantation performed in the following process but prevents impurities from being emitted into the air by activating thermal treatment. At this time, a silicon dioxide layer 4 is also formed on the underside. The silicon dioxide layer 4 is not necessarily formed by a thermal oxidation process and a step for depositing only on the surface may also be used using a device for chemical vapor deposition (CVD) and others.

Next, impurities are doped into a desired area of the SOI layer 3 by ion implantation. In the implantation of impurities, first, a p-type diffused layer electrode 5 is formed in the SOI layer 3 by implanting $BF_2$ ions by the dose of "$1 \times 10^{15}/cm^2$" after resist is left in only the desired area by resist patterning using photolithography. The p-type diffused layer 5 functions as an electrode for injecting holes after the completion of the device.

Figure 6A:
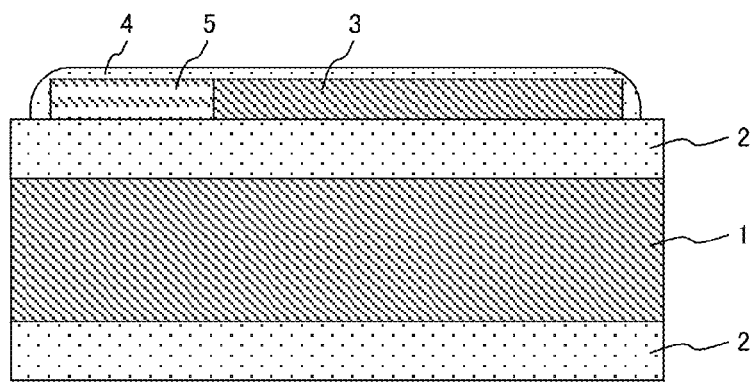
FIG. 6A is a sectional view for explaining the manufacturing process of the light-emitting element in the third embodiment.
Figure 6B:
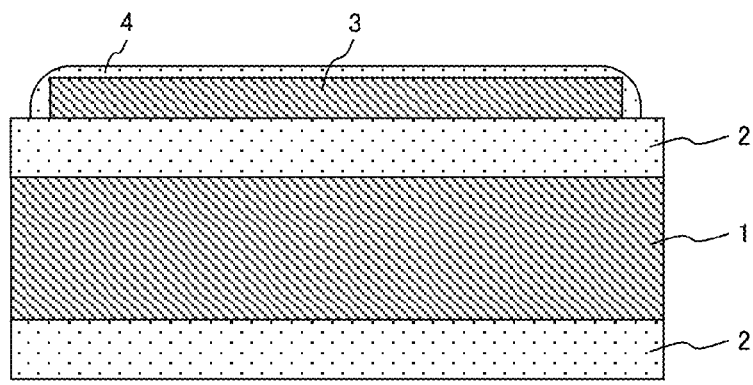
FIG. 6B is a sectional view for explaining the manufacturing process of the light-emitting element in the third embodiment.
Figure 6C:
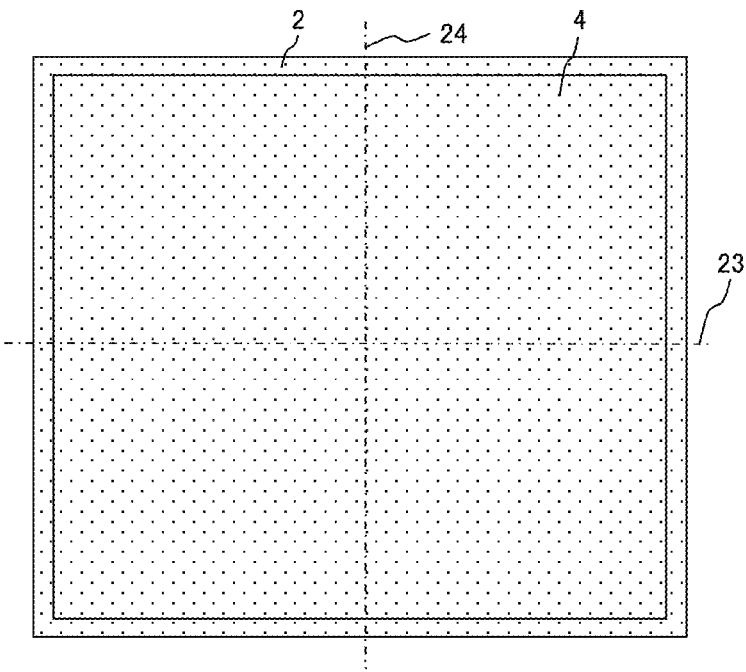
FIG. 6C is a schematic top view for explaining the manufacturing process of the light-emitting element in the third embodiment.

Next, the impurities are activated by annealing in an atmosphere of nitrogen heated at 900° C. for 20 minutes, simultaneously, the crystallinity of the SOI layer 3 is recovered, and a state shown in FIGS. 6A, 6B, 6C is acquired.

Figure 7A:
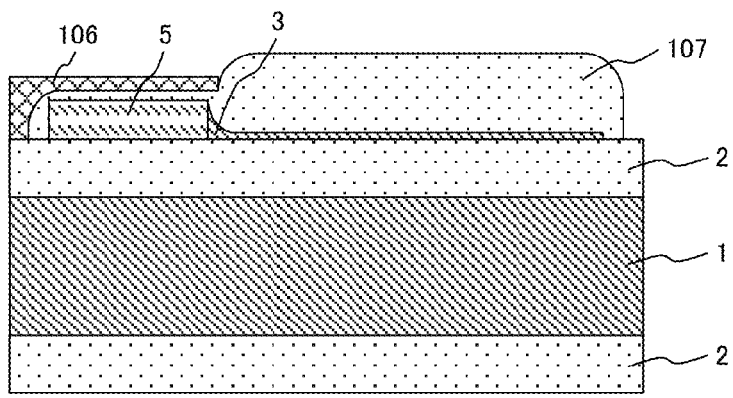
FIG. 7A is a sectional view for explaining the manufacturing process of the light-emitting element in the third embodiment.
Figure 7B:
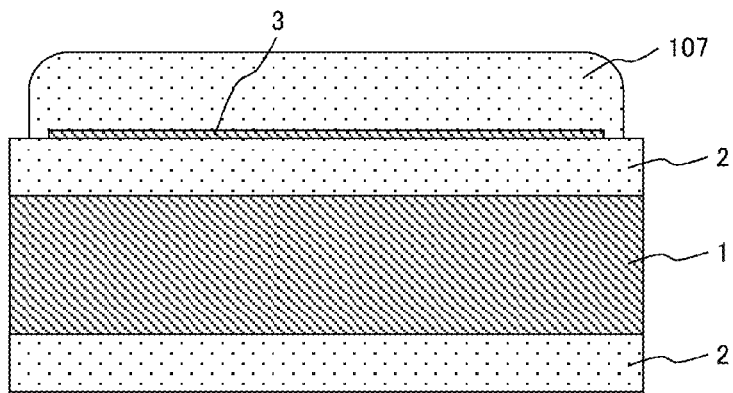
FIG. 7B is a sectional view for explaining the manufacturing process of the light-emitting element in the third embodiment.
Figure 7C:
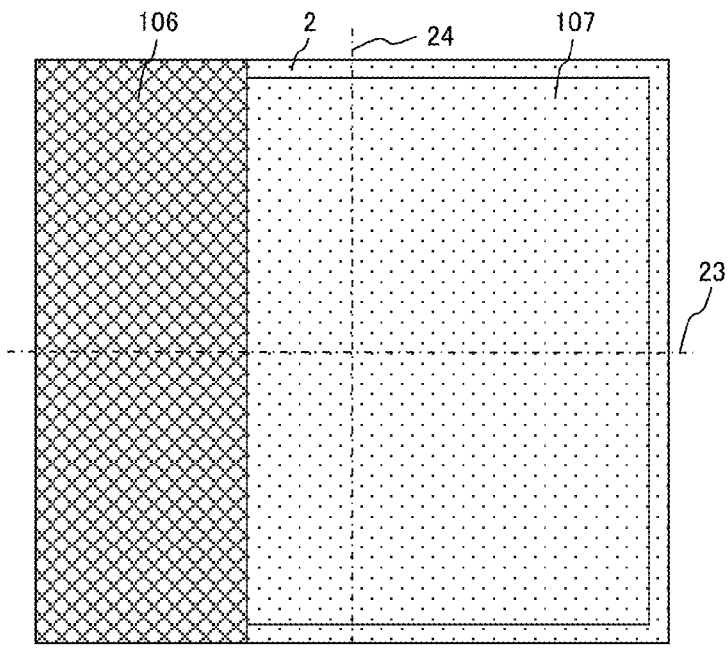
FIG. 7C is a schematic top view for explaining the manufacturing process of the light-emitting element in the third embodiment.

Next, after a silicon nitride layer 106 is deposited overall using a device for CVD and others, resist is left in only a desired area by resist patterning using photolithography and an opening is provided to a desired area of the silicon nitride layer 106 by anisotropic dry etching. Next, after a cleaning step, a silicon dioxide layer 107 is finally formed by alternatively performing the formation of the silicon dioxide layer by oxidation and the wet etching of the silicon dioxide layer using hydrofluoric acid, the SOI layer 3 in the opening is locally thinned to the thickness of 3 nm, and a state shown in FIGS. 7A, 7B, 7C is acquired. At this time, the SOI layer 3 locally thinned has thickness to an extent that quantum confinement effect manifests and band gap energy increases, compared with silicon in bulk. For the thickness of the SOI layer 3 as a barrier layer, although a finite value of 10 nm or less can be set, 4 nm or less is practical.

In this embodiment, a function of efficiently confining electrons is given to a germanium layer 108 by connecting the p-type diffused layer 5 and the germanium layer 108 which is a light emission layer formed later via the thinned SOI layer 3. Besides, since the surface of the thinned SOT layer 3 has a (ill) plane, emission from the thinned silicon barrier layer can be inhibited after the completion of the device.

Next, after the silicon nitride layer 106 is removed by wet etching using heated phosphoric acid and cleaning, resist is left in only a desired area by resist patterning using photolithography, the silicon dioxide layer in a desired area is removed by wet etching using hydrofluoric acid, and a part of the surface of the thinned SOI layer 3 is exposed. For a working method, anisotropic dry etching may also be used.

Though the following is not shown in the drawings for this embodiment, only silicon atoms included in a silicon germanium layer are selectively oxidized by performing a step for oxidation after the silicon germanium layer is selectively epitaxially grown in only the area in which the surface of the thinned SOI layer 3 is exposed, and a germanium layer can be locally formed on the BOX layer 2. Since a germanium layer 108 can be epitaxially grown on the germanium layer when the germanium layer 108 is epitaxially grown later if the germanium layer is formed on the BOX layer 2 as described above, strain on the germanium layer 108 caused by grid unconformity can be prevented.

Next, after a cleaning step, the germanium layer 108 acquired by selectively doping in an n type in only the area in which the surface of the thinned SOI layer 3 is exposed is epitaxially grown up to the thickness of 200 nm. In this process of epitaxial growth, extensional strain is applied to the germanium layer 108 by difference in a coefficient of thermal expansion between the germanium layer and the SOI layer 3 on the underside. Besides, since the germanium layer 108 functions not only as a light emission layer after the completion of the device but as an optical confinement layer, the germanium layer 108 is designed to be a linear optical resonator in this embodiment.

Besides, though the following is not shown in the drawings for this embodiment, a distributed feed-back (DFB) laser where the germanium layer functions not only as a light emission layer after the completion of the device but as an optical confinement layer in which the periodic variation of a refractive index can be applied to propagated light can also be produced by working the germanium layer 108 in plural pieces periodically arranged. In addition, though the following is not shown in the drawings for this embodiment, a ring type laser where the germanium layer 108 functions not only as a light emission layer after the completion of the device but as a ring type optical confinement layer which is free of loss by reflection on an end face of an optical waveguide can also be produced by designing the germanium layer 108 in a ring type.

Next, after an n-type diffused layer (electrode) 109 doped in an n type at high density by CVD and others and made of polycrystalline silicon is deposited overall, resist is left in only a desired area by resist patterning using photolithography, the n-type diffused layer electrode 109 is worked in a desired shape by anisotropic dry etching, and a state shown in FIGS. 8A, 8B, 8C is acquired. The SIO layer 3 between the germanium layer 108 and the p-type diffused layer electrode 5 has length that exceeds a size in which tunnel effect manifests. The n-type diffused layer electrode 109 functions as an electrode for injecting electrons after the completion of the device.

Next, after a silicon dioxide layer 110 is deposited by CVD and others, resist is left in only a desired area by resist patterning using photolithography and the silicon dioxide layer in a desired area is removed by wet etching using hydrofluoric acid. For a working method, anisotropic dry etching may also be used. Next, after a TiN layer and an Al layer are deposited overall, resist is left in only a desired area by resist patterning using photolithography, after the Al layer is worked by wet etching, the TiN layer is worked by wet etching, and as a result, a TiN electrode 111 and an Al electrode 112 are formed. For a working method, anisotropic dry etching may also be used.

Figure 9C:
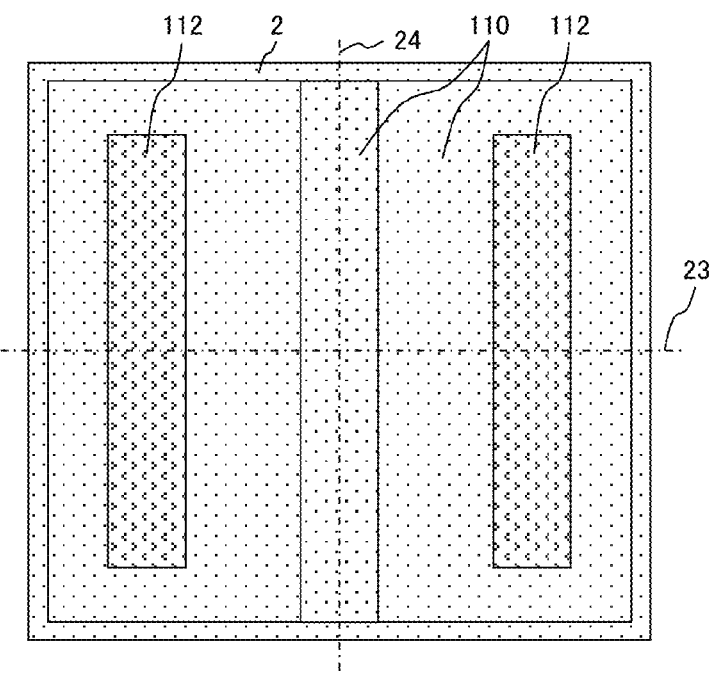
FIG. 9C is a schematic top view for explaining the manufacturing process of the light-emitting element in the third embodiment.

Next, the device is completed as shown in FIGS. 9A, 9B, 9C by performing hydrogen annealing and executing processing for hydrogen-terminating a defect caused in the process.

Referring to FIG. 9A, the configuration and operating characteristics of the device produced as described above, that is, the germanium laser will be described below.

The germanium light emission layer 108 is electrically connected to the p-type diffused layer electrode 5 via the thinned SOI layer 3 and simultaneously, is electrically connected to the n-type diffused layer electrode 109. At this time, band gap energy of the thinned SOI layer 3 increases by quantum confinement effect and the SOI layer functions as a barrier layer for efficiently confining electrons and holes in germanium. Besides, since the n-type diffused layer electrode is directly connected to the germanium light emission layer 108, resistance when current flows from the germanium light emission layer 108 to the n-type diffused layer electrode can be reduced. The germanium light emission layer 108 is linearly worked and also functions as a Fabry-Perot optical resonator.

In addition, though the following is not shown in the drawings for this embodiment, a mirror of distributed Bragg reflector (DBR) is formed by arranging pieces made of amorphous silicon in the vicinities of both ends in a longitudinal direction of the germanium light emission layer 108 linearly worked at a periodic interval, and a DBR germanium laser diode can also be produced. The DBR is a dielectric mirror configured based upon difference in a refractive index with a circumferential insulating film and high reflectance of 99.9% or more can be achieved. Since such a mirror having high reflectance can be simply formed in a silicon process, laser oscillation can be achieved even if emission from germanium is feeble. In the design of the DBR, the width and an interval of each piece made of amorphous silicon are important parameters and are set to be integral times of approximately a half of an emission wavelength in a medium.

Carriers are injected into the germanium light emission layer 108 at high density by making forward current flow between the p-type diffused layer electrode 5 and the n-type diffused layer electrode 109, an electron and a hole are recombined, and emission is made. Emitted light is strongly confined in the germanium light emission layer 108, when current that exceeds a threshold is made to flow, induced emission is caused, and a laser beam is oscillated.

Extensional strain is applied to the light emission layer and an oscillation wavelength is approximately 1600 nm which is a designed wavelength. Since a laser beam is emitted in parallel to the silicon substrate 1, it is also validated that the device is optimum for an application such as on-chip optical wiring.

FIGS. 9A, 9B, 9C show the process before a wiring step and the structures. However, when an optical integrated circuit is formed, desired wiring has only to be performed afterward. Besides, when an electronic circuit is also mounted, some of the abovementioned steps can be performed at the same time as steps for forming a transistor. When the optical device is produced in a normal silicon process as described above, coexistence with an electronic device is easy. Especially, since the germanium laser diode according to the present invention can oscillate in the vicinity of 1550 nm at which the transmission loss of an optical fiber is small, it is clarified that the reliable and low-priced laser can be provided, utilizing conventional type infrastructure for optical communication as it is.

According to this embodiment, electrons can be efficiently injected into the light emission layer made of a Group IV element and the light-emitting element (the Fabry-Perot laser diode) that can emit light efficiently can be provided.

Fourth Embodiment

A fourth embodiment will be described referring to FIGS. 1A to 3A, 10A and 11A, 1B to 3B, 10B and 11B, 1C to 3C, 10C and 11C below. The items described in the second embodiment or the third embodiment and undescribed in this embodiment can also be applied to this embodiment unless there are special circumstances. In this embodiment, a distributed feed-back (DFB) germanium laser diode produced by a method which enables easy formation using a normal silicon process and its manufacturing method will be described.

Figure 10A:
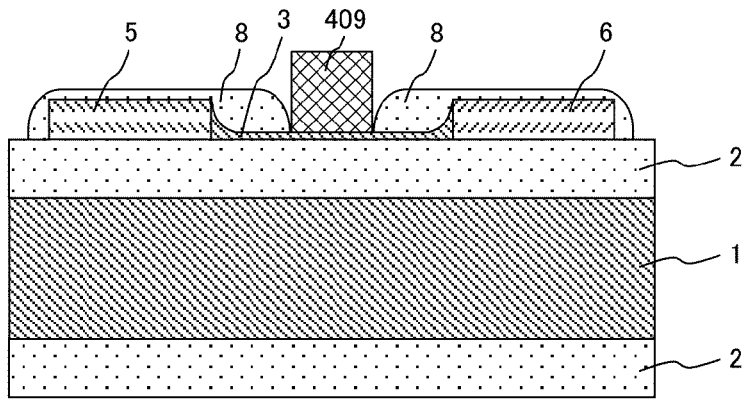
FIG. 10A is a sectional view for explaining the manufacturing process of the light-emitting element in the fourth embodiment.
Figure 10B:
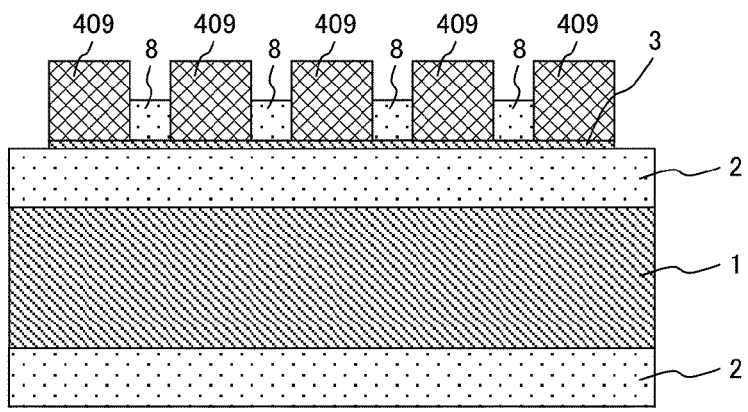
FIG. 10B is a sectional view for explaining the manufacturing process of the light-emitting element in the fourth embodiment.
Figure 10C:
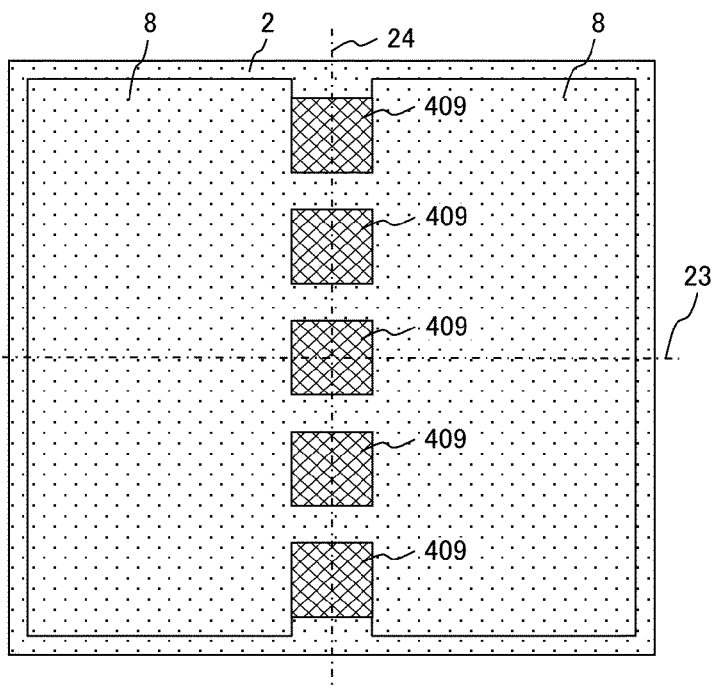
FIG. 10C is a schematic top view for explaining the manufacturing process of the light-emitting element in the fourth embodiment.
Figure 11A:
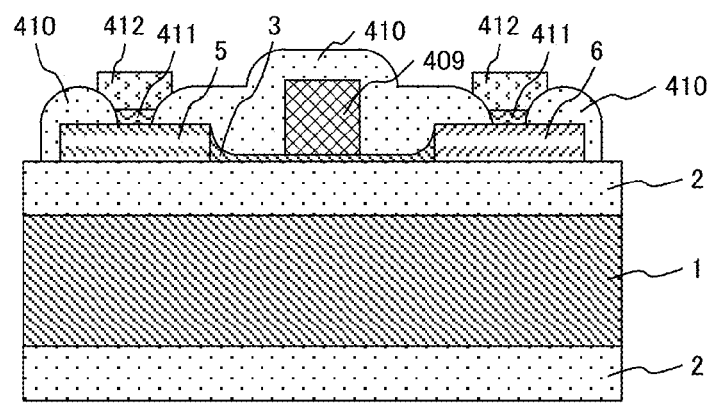
FIG. 11A is a sectional view for explaining the manufacturing process of the light-emitting element in the fourth embodiment.
Figure 11B:
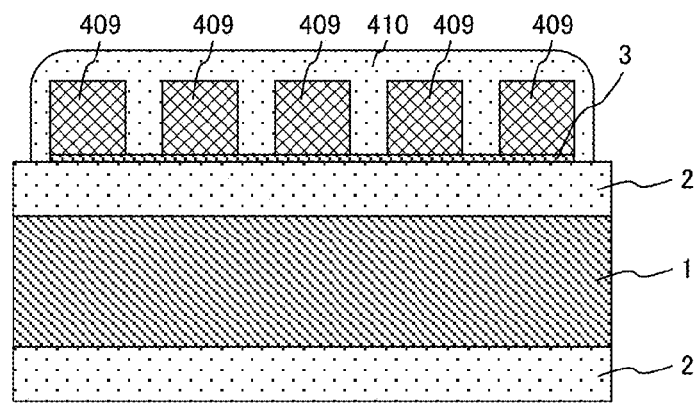
FIG. 11B is a sectional view for explaining the manufacturing process of the light-emitting element in the fourth embodiment.
Figure 11C:
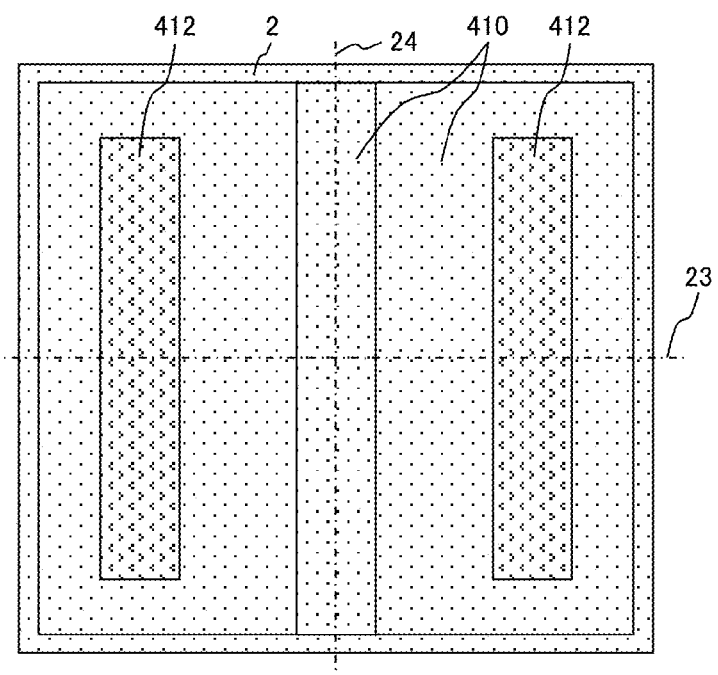
FIG. 11C is a schematic top view for explaining the manufacturing process of the light-emitting element in the fourth embodiment.

FIGS. 1A to 3A, 10A and 11A, 1B to 3B, 10B and 11B show sectional structures of the light-emitting element in the order of a manufacturing process. Besides, FIGS. 1C to 3C, 10C and 11C are schematic diagrams showing the light-emitting element viewed from the upside in the order of the manufacturing process. In this case, FIGS. 10A and 11A, 10B and 11B show the sectional structures when the light-emitting element is respectively cut along each horizontal line 23 and each vertical line 24 in FIGS. 10C and 11C. FIGS. 11A, 11B, 11C show the completed device in this embodiment.

The manufacturing process will be described in order below.

The description of the manufacturing process in FIGS. 1A to 3A, 1B to 3B, 1C to 3C is omitted because the process is the same as that in the second embodiment.

After the silicon nitride layer 7 is removed by wet etching using heated phosphoric acid and cleaning from the state shown in FIGS. 3A, 3B, 3C, resist is left in only a desired area by resist patterning using photolithography, the silicon dioxide layer in a desired area is removed by anisotropic dry etching, and a part of a surface of the thinned SOI layer 3 is opened. At this time, patterning is performed so that plural openings are periodically formed. The width and an interval of each opening are important parameters and are designed so that they are integral times of approximately a half of an emission wavelength in a medium of a completed device.

Though the following is not shown in the drawings for this embodiment, only silicon atoms included in a silicon germanium layer are selectively oxidized by performing an oxidation step after the silicon germanium layer is selectively epitaxially grown in only an area in which the surface of the thinned SOI layer 3 is exposed, and a germanium layer can be locally formed on the BOX layer 2. Since a germanium layer 409 can be epitaxially grown on the germanium layer when the germanium layer 409 is epitaxially grown later if the germanium layer is formed on the BOX layer 2 as described above, strain caused by grid unconformity on the germanium layer 409 can be prevented.

Next, after a cleaning step, the germanium layer 409 acquired by selectively doping in an n type in only the area in which the surface of the thinned SOI layer 3 is exposed is epitaxially grown up to the thickness of 200 nm and a state shown in FIGS. 10A, 10B, 10C is acquired. The SIO layer 3 between the germanium layer 409 and the p-type diffused layer electrode 5 has length that exceeds a size in which tunnel effect manifests. In this process of epitaxial growth, extensional strain is applied to the germanium layer 409 by difference in a coefficient of thermal expansion between the germanium layer and the SOI layer 3 on the underside. Besides, since the germanium layer 409 functions not only as a light emission layer after the completion of the device but as an optical confinement layer, it is designed so that in this embodiment, plural pieces are periodically formed for the germanium layer 409 and the germanium layer functions as a DFB optical resonator.

Next, after a silicon dioxide layer 410 is deposited by CVD and others, resist is left in only a desired area by resist patterning using photolithography and the silicon dioxide layer in a desired area is removed by wet etching using hydrofluoric acid. For a working method, anisotropic dry etching may also be used. Next, after a TiN layer and an Al layer are deposited overall, resist is left in only a desired area by resist patterning using photolithography, after the Al layer is worked by wet etching, the TiN layer is worked by wet etching, and as a result, a TiN electrode 411 and an Al electrode 412 are formed. For a working method, anisotropic dry etching may also be used.

Next, the device is completed as shown in FIGS. 11A, 11B, 11C by performing hydrogen annealing and executing processing for hydrogen-terminating a defect caused in the process.

Referring to FIG. 11A, the configuration and operating characteristics of the device produced as described above, that is, the germanium laser will be described below.

The germanium light emission layer 409 is electrically connected to the p-type diffused layer electrode 5 and the n-type diffused layer electrode 6 via the thinned SOI layer 3. At this time, band gap energy of the thinned SOI layer 3 increases by quantum confinement effect and the SOI layer functions as a barrier layer in which electrons and holes are efficiently confined in the germanium layer. The germanium light emission layer 409 is worked in the plural pieces periodically arrayed and also functions as a DFB optical resonator. In the design of the DFB mirror, the width and an interval of each piece of the germanium light emission layer 409 are important parameters and are designed so that they are integral times of approximately a half of an emission wavelength in a medium.

Carriers are injected into the germanium light emission layer 409 at high density by making forward current flow between the p-type diffused layer electrode 5 and the n-type diffused layer electrode 6, an electron and a hole are recombined, and emission is made. Emitted light is strongly confined in the germanium light emission layer 409, when current that exceeds a threshold is made to flow, induced emission is caused, and the laser is oscillated. Extensional strain is applied to the light emission layer and an oscillation wavelength is approximately 1600 nm which is a designed wavelength. Since a laser beam is emitted in parallel to the silicon substrate 1, it is also validated that the laser is optimum for an application such as on-chip optical wiring.

In FIGS. 11A, 11B, 11C, the process before a wiring step and structure are shown. However, when an optical integrated circuit is formed, desired wiring step has only to be performed afterward. Besides, when an electronic circuit is also mounted, some of the abovementioned process can be performed at the same time as a process for forming a transistor.

When the optical device is produced in a normal silicon process as described above, coexistence with an electronic device is easy. Especially, it is clarified that the germanium laser diode equivalent to this embodiment can emit light in the vicinity of 1550 nm at which the transmission loss of an optical fiber is small, the reliable and low-priced laser can be provided utilizing conventional type infrastructure for optical communication as it is.

According to this embodiment, the light-emitting element (the distributed feed-back laser diode) in which electrons can be efficiently injected into the light emission layer made of the Group IV element and which can efficiently emit light can be provided.

Fifth Embodiment

A fifth embodiment will be described referring to FIGS. 12A to 15A, 12B to 15B, 12C to 15C below. The items described in any of the second to fourth embodiments and undescribed in this embodiment can also be applied to this embodiment unless there are special circumstances. In this embodiment, a DFB germanium laser diode where a monocrystalline thin film (hereinafter called a fin) formed perpendicularly to a substrate functions as a barrier layer for confining carriers and its manufacturing method are disclosed.

Figure 14A:
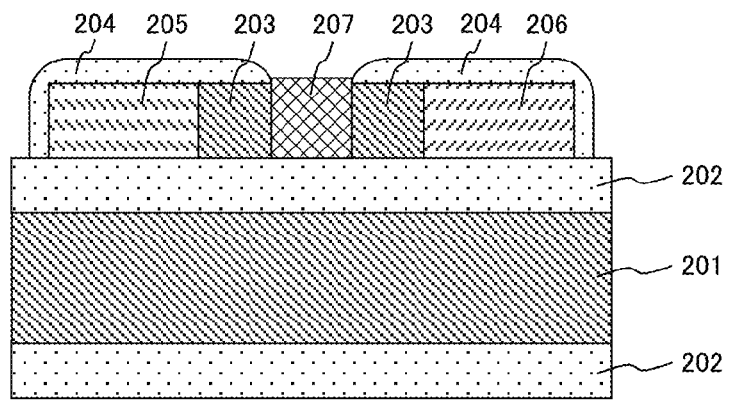
FIG. 14A is a sectional view for explaining the manufacturing process of the light-emitting element in the fifth embodiment.
Figure 14B:
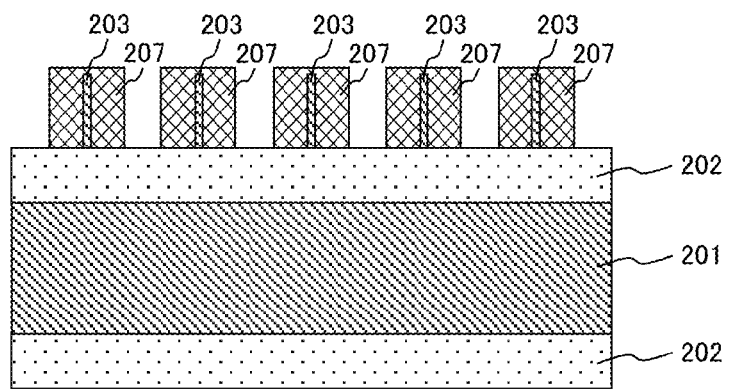
FIG. 14B is a sectional view for explaining the manufacturing process of the light-emitting element in the fifth embodiment.
Figure 14C:
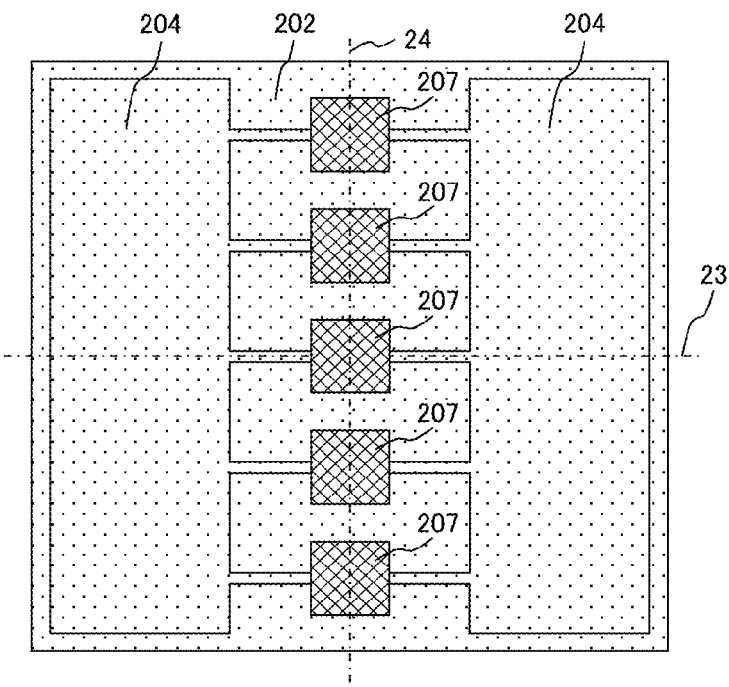
FIG. 14C is a schematic top view for explaining the manufacturing process of the light-emitting element in the fifth embodiment.
Figure 15A:
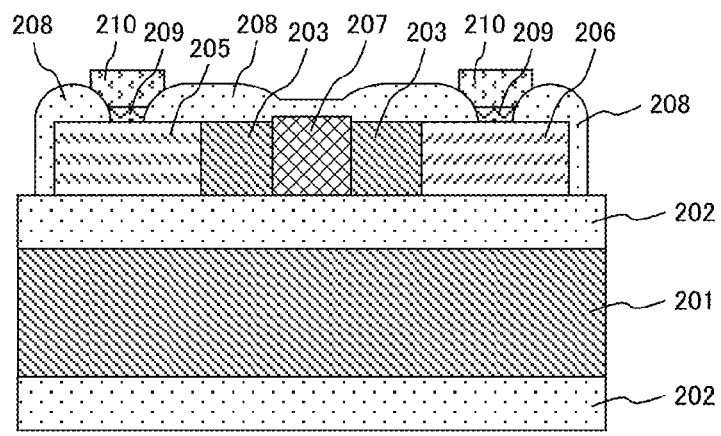
FIG. 15A is a sectional view for explaining the manufacturing process of the light-emitting element in the fifth embodiment.
Figure 15B:
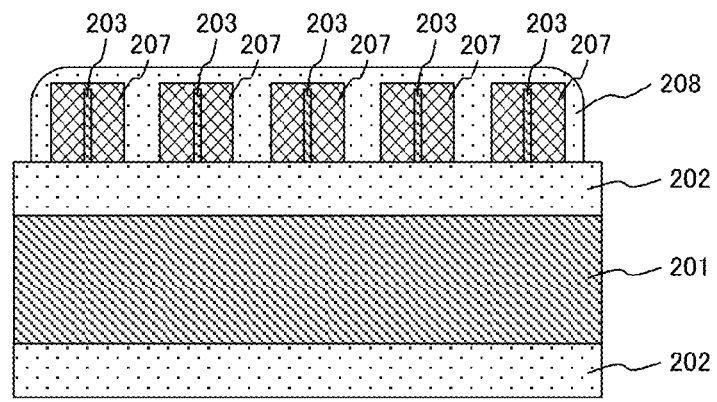
FIG. 15B is a sectional view for explaining the manufacturing process of the light-emitting element in the fifth embodiment.

FIGS. 12A to 15A and 12B to 15B show sectional structures of the light-emitting element in the order of a manufacturing process. Besides, FIGS. 12C to 15C are schematic diagrams showing the light-emitting element viewed from the upside in the order of the manufacturing process. FIGS. 12A to 15A and 12B to 15B show the sectional structures when the light-emitting element is respectively cut along each horizontal line 23 and each vertical line 24 respectively in FIGS. 12C to 15C. FIGS. 15A, 15B, 15C show the completed device in this embodiment.

The manufacturing process will be described in order below.

Figure 12A:
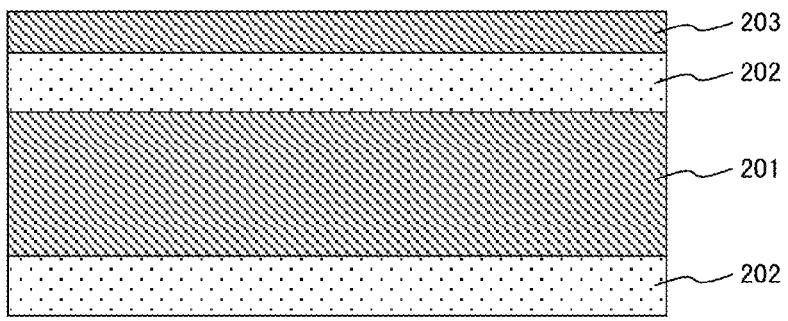
FIG. 12A is a sectional view for explaining a manufacturing process of a light-emitting element in a fifth embodiment.
Figure 12B:
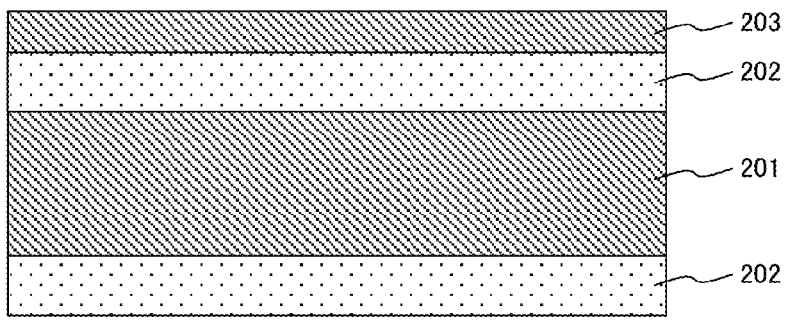
FIG. 12B is a sectional view for explaining the manufacturing process of the light-emitting element in the fifth embodiment.
Figure 12C:
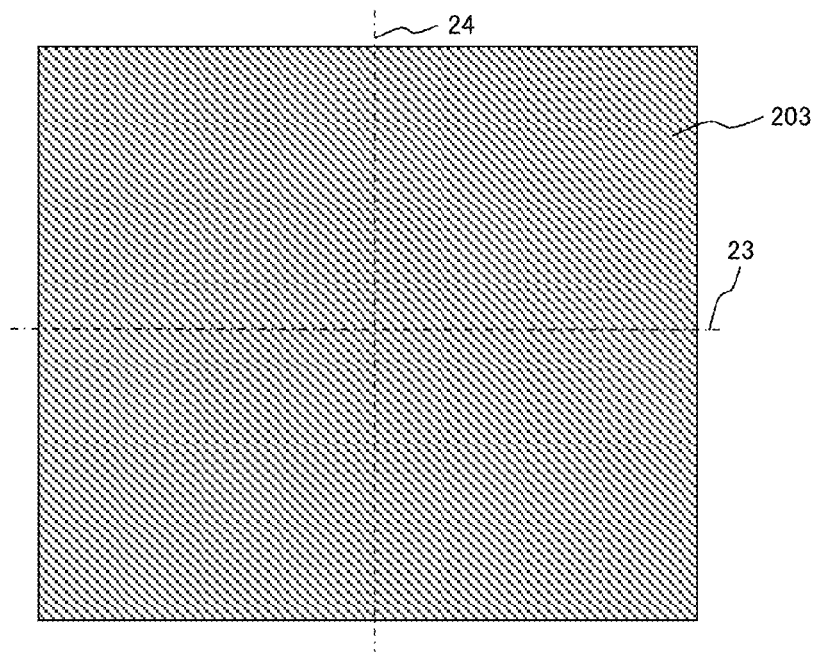
FIG. 12C is a schematic top view for explaining the manufacturing process of the light-emitting element in the fifth embodiment.

First, as shown in FIGS. 12A, 12B, 12C, an SOI substrate in which a silicon substrate 201 as a support substrate, a BOX layer (a silicon dioxide layer) 202 and an SOI layer 203 are laminated is prepared. The SOI layer 203 produced as a prototype in this embodiment has a (112) plane on its surface and initial thickness before the process is 200 nm. Besides, the thickness of the silicon dioxide layer 202 is 2000 nm.

After resist is applied, the SOI layer 203 is worked in a mesa shape by anisotropic dry etching after the resist is left in only a desired area by mask exposure by photolithography. At this time, the SOI layer 203 in an area to be a light emission layer later is worked in the shape of a fin. At this time, the SOI layer is properly patterned so that a side wall of a fin has a (111) plane.

Next, after a cleaning step, a silicon dioxide layer 204 is formed by oxidizing a surface of the SOI layer 203 and the SOI layer 203 in the area worked in the fin shape is worked in a monocrystalline thin film formed perpendicularly to the substrate. At this time, the thickness of the formed thin film (fin) is 3 nm and is thickness to an extent that the increase of a band gap by quantum confinement effect manifests. The thickness of the SOI layer (fin) 203 as a barrier layer can have a finite value of 10 nm or less, though 4 nm or less is practical. Besides, while, in FIG. 13B, only five fins are shown, the number of fins can actually be arbitrarily increased and when the number of fins is increased, the intensity of emission can be enhanced. In addition, the silicon dioxide layer 204 not only reduces damage applied to the SOI layer 203 by ion implantation performed in the following process but inhibits the diffusion into the air of impurities by activating thermal treatment. At this time, a silicon dioxide layer 204 is also formed on the underside.

Next, impurities are implanted in a desired area of the SOI layer 203 by ion implantation. In the implantation of impurities, first, a p-type diffused layer electrode 205 is formed in the SOI layer 203 by implanting $BF_2$ ions by a dose of "$1 \times 10^{15}/cm^2$" after n resist is left in only a desired area by resist patterning using photolithography. Next, after the resist is removed, an n-type diffused layer 206 is formed in the SOI layer 203 by implanting P ions by a dose of "$1 \times 10^{15}/cm^2$" after resist is left in only a desired area by resist patterning using photolithography again. The p-type diffused layer 205 and the n-type diffused layer 206 function as an electrode for respectively injecting holes and electrons after the completion of the device.

Figure 13A:
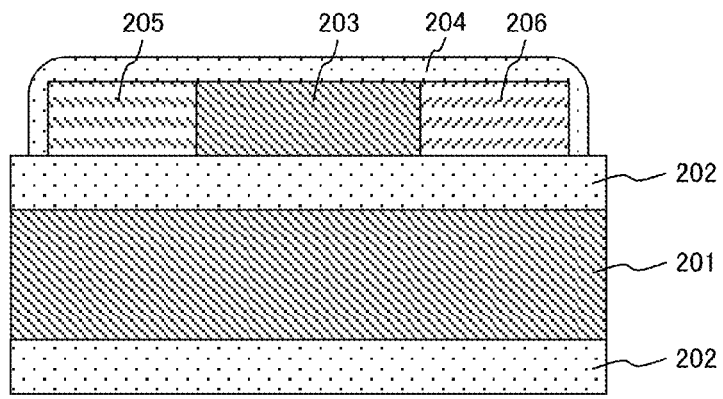
FIG. 13A is a sectional view for explaining the manufacturing process of the light-emitting element in the fifth embodiment.
Figure 13B:
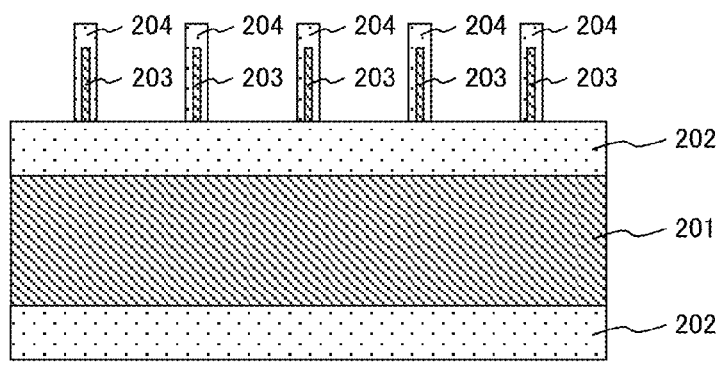
FIG. 13B is a sectional view for explaining the manufacturing process of the light-emitting element in the fifth embodiment.
Figure 13C:
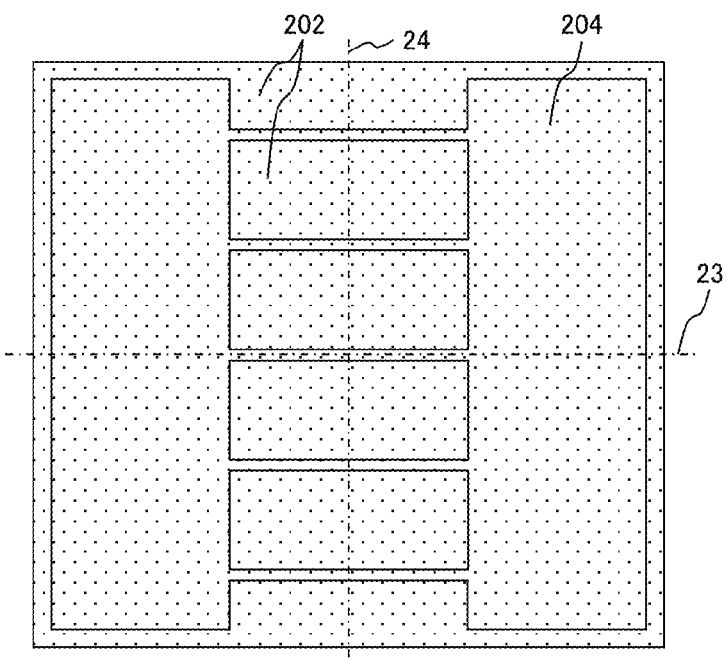
FIG. 13C is a schematic top view for explaining the manufacturing process of the light-emitting element in the fifth embodiment.

Next, the impurities are activated by annealing in an atmosphere of nitrogen of 900° C. for 20 minutes, simultaneously, the crystallinity of the SOI layer 203 is recovered, and a state shown in FIGS. 13A, 13B, 13C is acquired.

Next, resist is left in only a desired area by resist patterning using photolithography, the silicon dioxide layer in a desired area is removed by wet etching using hydrofluoric acid, and a part of the surface of the SOI layer 203 in the fin shape is exposed.

Though the following is not shown in the drawings for this embodiment, only silicon atoms included in a silicon germanium layer are selectively oxidized by performing an oxidation step after the silicon germanium layer is selectively epitaxially grown in only an area in which the surface of the SOI layer 203 in the fin shape is exposed, and a germanium fin can be locally formed. Since a germanium layer 207 can be epitaxially grown on the germanium layer when the germanium layer 207 is epitaxially grown later if the germanium fin is formed on the BOX layer 202 as described above, strain caused by grid unconformity on the germanium layer 207 can be prevented.

Next, after a cleaning step, the germanium layer 207 acquired by selectively doping in an n type in only the area in which the surface of the thinned SOI layer 203 is exposed is epitaxially grown and a state shown in FIGS. 14A, 14B, 14C is acquired. The SOI layer 203 between the germanium layer 207 and the p-type diffused layer electrode 205 has length that exceeds a size in which tunnel effect manifests. In this process of epitaxial growth, extensional strain is applied to the germanium layer 207 by difference in a coefficient of thermal expansion between the germanium layer and the SOI layer 203 in the fin shape on the underside. Besides, since the germanium layer 207 functions not only as a light emission layer after the completion of the device but as an optical confinement layer, the germanium layer 207 is worked in plural pieces periodically arrayed in this embodiment and also functions as a DFB optical resonator.

Next, after a silicon dioxide layer 208 is deposited by CVD and others, resist is left in only a desired area by resist patterning using photolithography and the silicon dioxide layer in a desired area is removed by wet etching using hydrofluoric acid. For a working method, anisotropic dry etching may also be used. Next, after a TiN layer and an Al layer are deposited overall, resist is left in only a desired area by resist patterning using photolithography, the TiN layer is worked by wet etching after the Al layer is worked by wet etching, and as a result, a TiN electrode 209 and an Al electrode 210 are formed. For a working method, anisotropic dry etching may also be used.

Figure 15C:
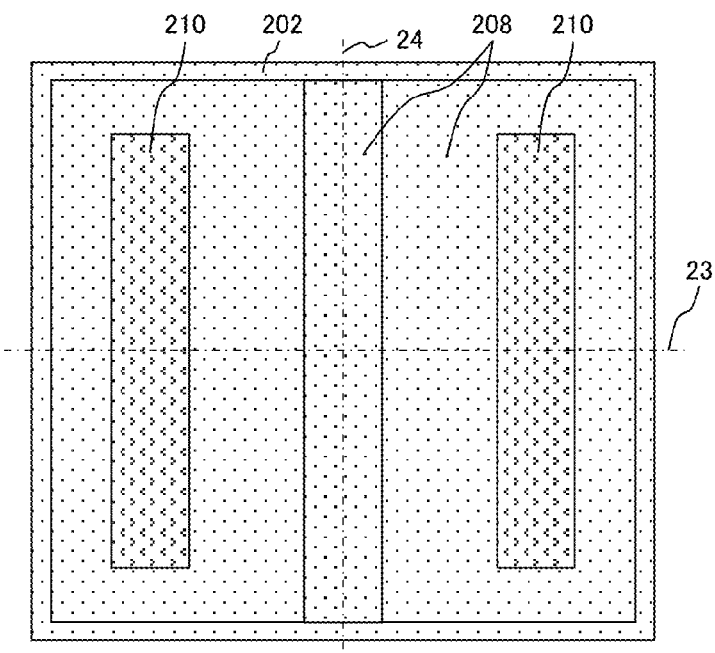
FIG. 15C is a schematic top view for explaining the manufacturing process of the light-emitting element in the fifth embodiment.

Next, a state shown in FIGS. 15A, 15B, 15C is acquired by performing hydrogen annealing and executing processing for hydrogen-terminating a defect caused in the process and the device is completed.

Referring to FIG. 15A, the configuration and operating characteristics of the device produced as described above, that is, the germanium laser will be described below.

The germanium light emission layer 207 is electrically connected to the p-type diffused layer electrode 205 and the n-type diffused layer electrode 206 via the SOI layer 203 worked in the fin shape. At this time, band gap energy of the SOI layer 203 worked in the fin shape increases by quantum confinement effect and the SOI layer functions as a barrier layer for efficiently confining electrons and holes in germanium. Since the barrier layer is formed in the fin shape having three-dimensional structure, electric resistance of the barrier layer is reduced by arbitrarily increasing the height and the density of each fin, and the intensity of emission can be enhanced. The germanium light emission layer 207 is worked in the plural pieces periodically arrayed and also functions as a DFB optical resonator. In the design of the DFB mirror, the width and an interval of each piece of the germanium layer 207 are important parameters and they are designed so that they are integral times of approximately a half of an emission wavelength in a medium.

Carriers are injected into the germanium light emission layer 207 at high density by making forward current flow between the p-type diffused layer electrode 205 and the n-type diffused layer electrode 206, an electron and a hole are recombined, and emission is made. Emitted light is strongly confined in the germanium light emission layer 207, when current that exceeds a threshold is made to flow, induced emission is caused, and a laser beam is oscillated. Extensional strain is applied to the light emission layer and an oscillation wavelength is approximately 1600 nm which is a designed wavelength. Since a laser beam is emitted in parallel to the silicon substrate 201, it is also validated that the device is optimum for an application such as on-chip optical wiring.

In FIGS. 15A, 15B, 15C, the process before a wiring step and the structure are shown. However, when an optical integrated circuit is formed, desired wiring has only to be made afterward. Besides, when an electronic circuit is also mounted, some of the abovementioned steps can be performed at the same time as a process for forming a transistor. When the optical device is produced in a normal silicon process as described above, coexistence with an electronic device is easy. Especially, since the germanium laser diode equivalent to this embodiment can oscillate in the vicinity of 1550 nm at which the transmission loss of an optical fiber is small, it is clarified that the reliable and low-priced laser can be provided utilizing conventional type infrastructure for optical communication as it is.

According to this embodiment, electrons can be efficiently injected into the light emission layer made of a Group IV element and the light-emitting element (the DFB laser diode) which can efficiently emit light can be provided. Besides, the intensity of emission can be enhanced by making the barrier layer fin structure.

Sixth Embodiment

A sixth embodiment will be described referring FIGS. 1A, 16A to 19A, 1B, 16B to 19B, 1C, 16C to 19C below. The items described in any of the second to fifth embodiments and undescribed in this embodiment can also be applied to this embodiment unless there are special circumstances. In this embodiment, a DFB germanium laser diode where a DFB germanium laser diode where a single crystal worked in the shape of nanowire (hereinafter, called nanowire) functions as a barrier layer for confining carriers and its manufacturing method will be described.

FIGS. 1A, 16A to 19A, 1B, 16B to 19B show sectional structures of the light-emitting element in the order of a manufacturing process. Besides, FIGS. 1C and 16C to 19C are schematic diagrams showing the light-emitting element viewed from the upside in the order of the manufacturing process.

In this case, FIGS. 1A, 16A to 19A, 1B, 16B to 19B show the sectional structures when the light-emitting element is cut respectively along a horizontal line 23 and a vertical line 24 in FIGS. 1C and 16C to 19C.

Figure 19A:
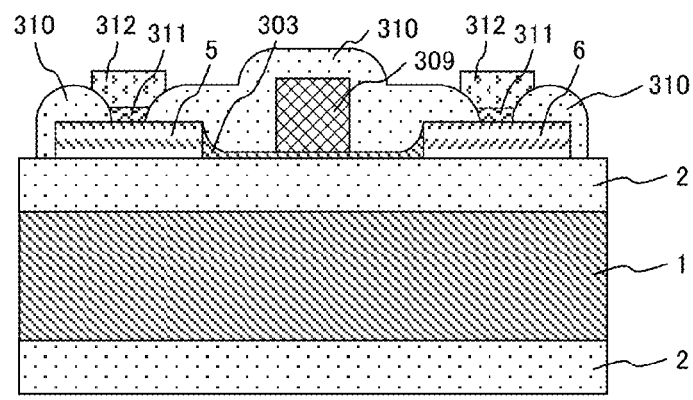
FIG. 19A is a sectional view for explaining the manufacturing process of the light-emitting element in the sixth embodiment.
Figure 19B:
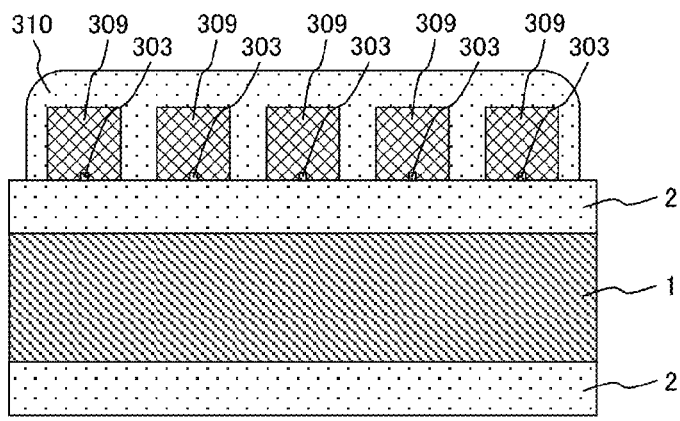
FIG. 19B is a sectional view for explaining the manufacturing process of the light-emitting element in the sixth embodiment.
Figure 19C:
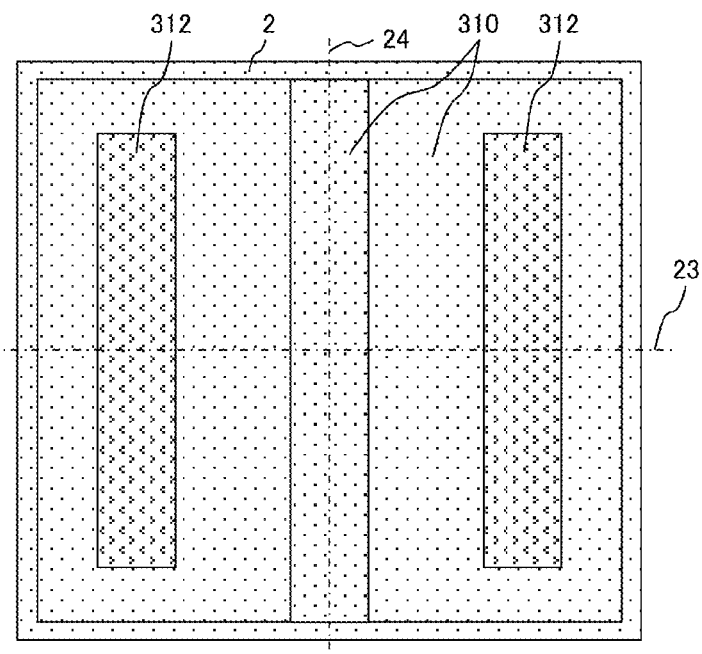
FIG. 19C is a schematic top view for explaining the manufacturing process of the light-emitting element in the sixth embodiment.

FIGS. 19A, 19B, 19C show the completed device in this embodiment.

The manufacturing process will be described in order below.

The description of the manufacturing process shown in FIGS. 1A, 1B, 1C is omitted because the process is the same as that in the second embodiment.

After resist is applied from a state shown in FIGS. 1A, 1B, 1C, the SOI layer 303 is worked in a mesa shape by anisotropic dry etching after resist is left in only a desired area by mask exposure by photolithography.

Next, after a cleaning step, a surface of the SOI layer 303 is oxidized to protect the surface and a silicon dioxide layer 4 having the thickness of approximately 30 nm is formed.

The silicon dioxide layer 4 not only reduces damage applied to the SOI layer 303 by ion implantation performed in the following process but inhibits the emission of impurities into the air by activating heat treatment. At this time, a silicon dioxide layer 4 is also formed on the underside. The silicon dioxide layer 4 is not necessarily required to be formed by a thermal oxidation process and a step for depositing only on the surface may also be used using a device for chemical vapor deposition (CVD) and others.

Next, impurities are implanted in a desired area of the SOI layer 303 by ion implantation. In the implantation of impurities, first, a p-type diffused layer electrode 5 is formed in the SOI layer 303 by implanting $BF_2$ ions by a dose of "$1\times10^{15}/cm^2$" after resist is left in only a desired area by resist patterning using photolithography. Next, after the resist is removed, an n-type diffused layer 6 is formed in the SOI layer 303 by implanting P ions at a dose of "$1\times10^{15}/cm^2$" after resist is left in only a desired area by resist patterning using photolithography again. The p-type diffused layer 5 and the n-type diffused layer 6 function as an electrode for respectively injecting holes and electrons after the completion of the device.

Figure 16A:
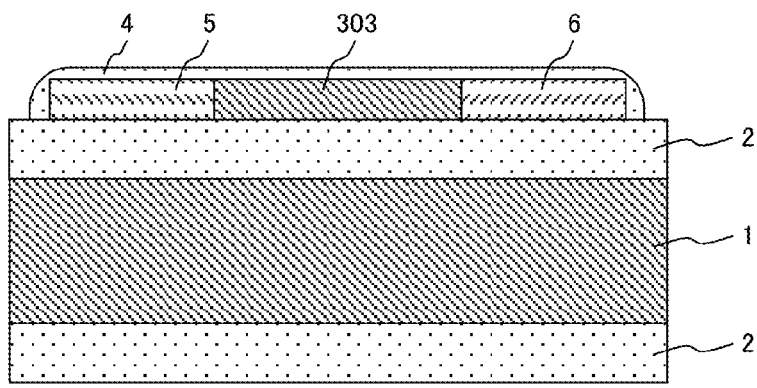
FIG. 16A is a sectional view for explaining the manufacturing process of the light-emitting element in the sixth embodiment.
Figure 16B:
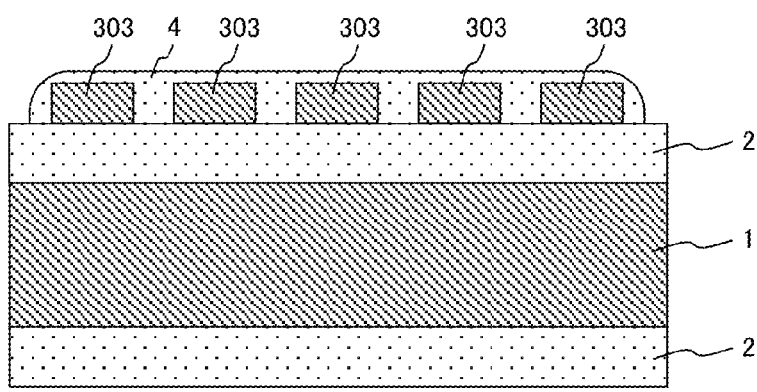
FIG. 16B is a sectional view for explaining the manufacturing process of the light-emitting element in the sixth embodiment.
Figure 16C:
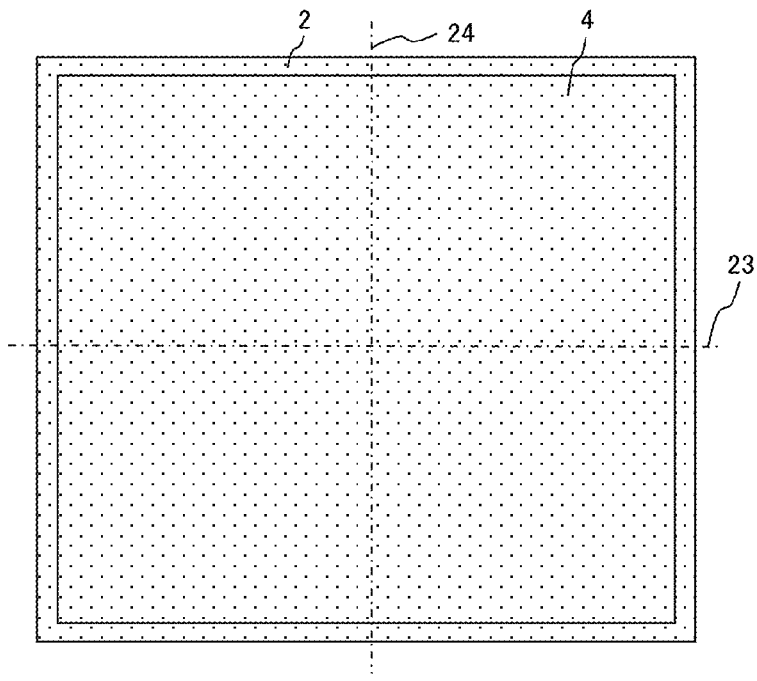
FIG. 16C is a schematic top view for explaining the manufacturing process of the light-emitting element in the sixth embodiment.

Next, the impurities are activated by annealing in an atmosphere of nitrogen of 900° C. for 20 minutes, simultaneously, the crystallinity of the SOI layer 303 is recovered, and a state shown in FIGS. 16A, 16B, 16C is acquired.

Next, after a silicon nitride layer 307 is deposited overall using the device for CVD and others, resist is left in only a desired area by resist patterning using photolithography and an opening is provided to a desired area of the silicon nitride layer 307 by anisotropic dry etching.

Figure 17A:
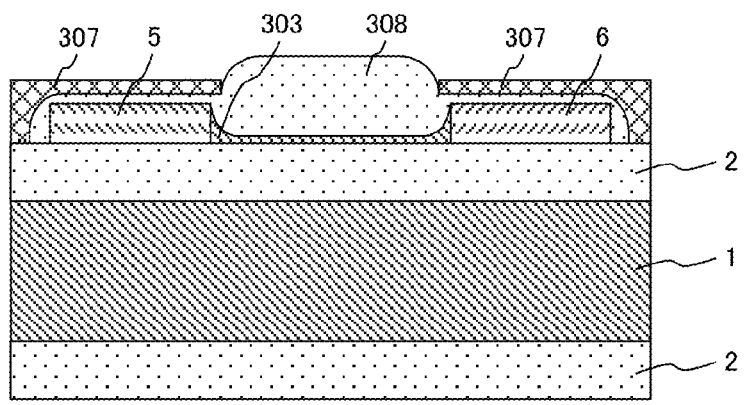
FIG. 17A is a sectional view for explaining the manufacturing process of the light-emitting element in the sixth embodiment.
Figure 17B:
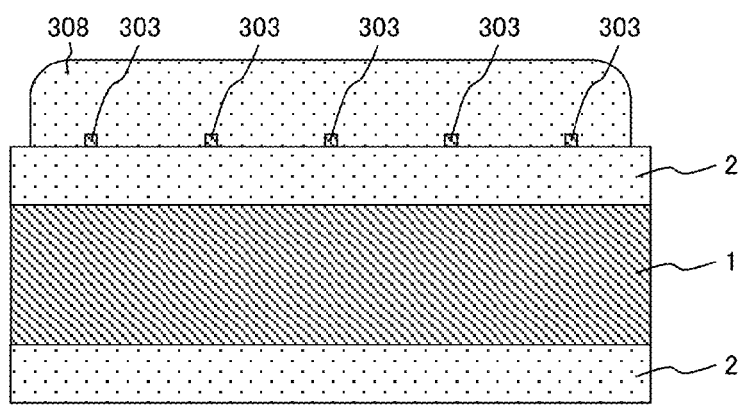
FIG. 17B is a sectional view for explaining the manufacturing process of the light-emitting element in the sixth embodiment.
Figure 17C:
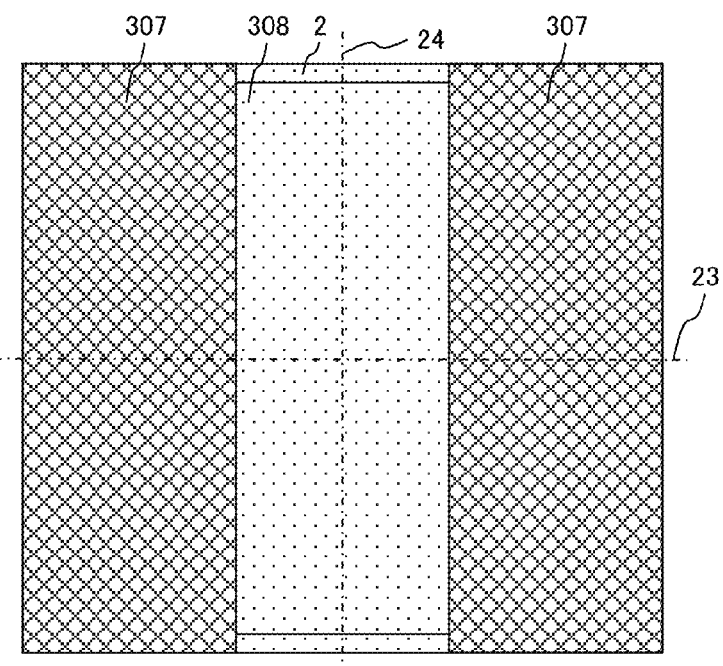
FIG. 17C is a schematic top view for explaining the manufacturing process of the light-emitting element in the sixth embodiment.

Next, after a cleaning step, a silicon dioxide layer 308 is finally formed by alternatively performing the formation of a silicon dioxide layer by oxidation and the wet etching of the silicon dioxide layer using hydrofluoric acid, the SOI layer 303 in the opening is locally worked to have the thickness and the width of 3 nm, and a state shown in FIGS. 17A, 17B, 17C is acquired. At this time, the SOI layer 303 locally worked in the shape of nanowire has thickness to an extent that quantum confinement effect manifests and band gap energy increases, compared with silicon in bulk. For the thickness and the width of the SOI layer (nanowire) 303 as a barrier layer, a finite value of 10 nm or less can be set, thought 4 nm or less is practical.

In this embodiment, a function for efficiently confining electrons is given to a germanium layer 309 by connecting the p-type diffused layer 5 and the germanium layer 309 which is a light emission layer formed later via the thinned SOI layer 303.

Next, after the silicon nitride layer 307 is removed by wet etching using heated phosphoric acid and cleaning, resist is left in only a desired area by resist patterning using photolithography, the silicon dioxide layer in a desired area is removed by wet etching using hydrofluoric acid, and a part of the surface of the SOI layer 303 worked in the shape of nanowire is exposed. For a working method, anisotropic dry etching may also be used.

Though the following is not shown in the drawings for this embodiment, only silicon atoms included in a silicon germanium layer are selectively oxidized by performing a step for oxidation after the silicon germanium layer is selectively epitaxially grown in only an area in which the surface of the SOI layer 303 worked in the shape of nanowire is exposed, and germanium nanowire can be locally formed on the BOX layer 2. Since to the germanium layer 309 can be epitaxially grown on the germanium layer when the germanium layer 309 is epitaxially grown later if the germanium layer is formed on the BOX layer 2 as described above, strain caused by grid unconformity on the germanium layer 309 can be prevented.

Figure 18A:
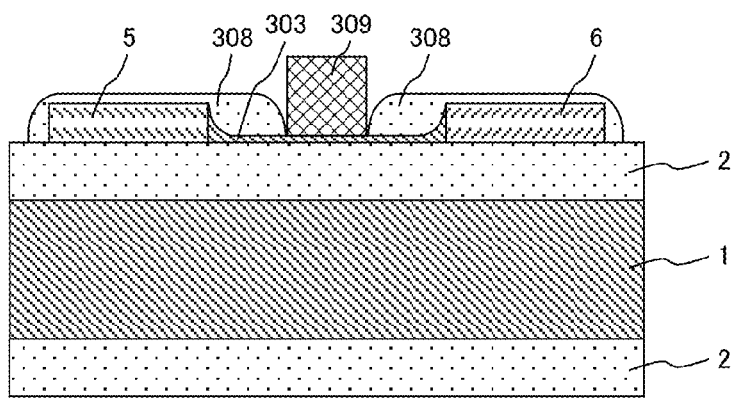
FIG. 18A is a sectional view for explaining the manufacturing process of the light-emitting element in the sixth embodiment.
Figure 18B:
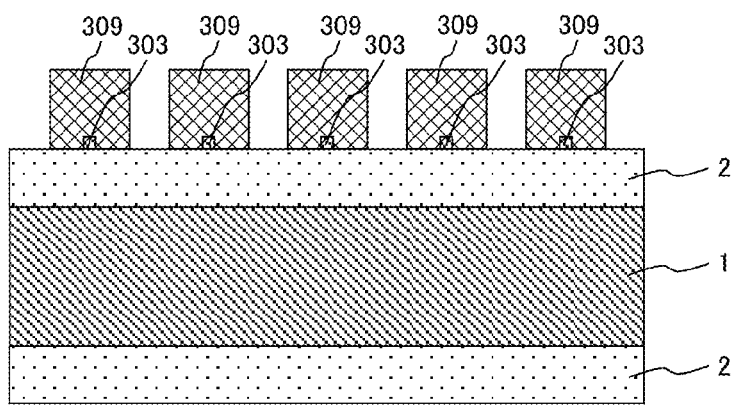
FIG. 18B is a sectional view for explaining the manufacturing process of the light-emitting element in the sixth embodiment.
Figure 18C:
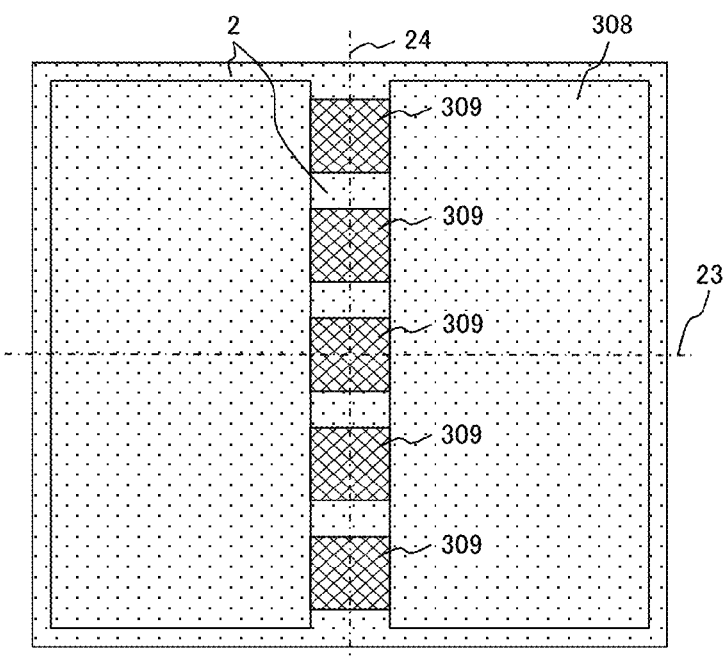
FIG. 18C is a schematic top view for explaining the manufacturing process of the light-emitting element in the sixth embodiment.

Next, after a cleaning step, the germanium layer 309 acquired by selectively doping in an n type in only an area in which the surface of the thinned SOI layer 303 is exposed is epitaxially grown up to the thickness of 200 nm and a state shown in FIGS. 18A, 18B, 18C is acquired. The SIO layer 303 between the germanium layer 309 and the p-type diffused layer electrode 5 has length that exceeds a size in which tunnel effect manifests. In this process of epitaxial growth, extensional strain is applied to the germanium layer 309 by difference in a coefficient of thermal expansion between the germanium layer and the SOI layer 303 on the underside. Besides, since the germanium layer 309 functions not only as a light emission layer after the completion of the device but as an optical confinement layer, the germanium layer 309 is worked in plural pieces periodically arrayed in this embodiment and also functions as a DFB optical resonator.

Next, after a silicon dioxide layer 310 is deposited by CVD and others, resist is left in only a desired area by resist patterning using photolithography and the silicon dioxide layer in a desired area is removed by wet etching using hydrofluoric acid. For a working method, anisotropic dry etching may also be used. Next, after a TiN layer and an Al layer are deposited overall, resist is left in only a desired area by resist patterning using photolithography, after the Al layer is worked by wet etching, the TiN layer is worked by wet etching, and as a result, a TiN electrode 311 and an Al electrode 312 are formed. For a working method, anisotropic dry etching may also be used.

Next, the device is completed as shown in FIGS. 19A, 19B, 19C by performing hydrogen annealing and performing processing for hydrogen-terminating a defect caused in the process.

Referring to FIG. 19A, the configuration and operating characteristics of the device produced as described above, that is, the germanium laser will be described below.

The germanium light emission layer 309 is electrically connected to the p-type diffused layer electrode 5 and the n-type diffused layer electrode 6 via the SOI layer 303 worked in the shape of nanowire. At this time, band gap energy of the SOI layer 303 worked in the shape of nanowire increases by quantum confinement effect and functions as a barrier layer for efficiently confining electrons and holes in the germanium. Since the barrier layer is formed in the shape of nanowire having two-dimensional structure, electric resistance of the barrier layer is reduced by arbitrarily increasing the thickness (film thickness and width) and the density of nanowire and the intensity of emission can be enhanced.

The germanium light emission layer 309 is worked in plural pieces periodically arrayed and also functions as a DFB optical resonator. In the design of the DFB mirror, the width and an interval of each piece of the germanium layer 309 are important parameters and they are designed to be integral times of approximately a half of an emission wavelength in a medium.

Carriers are injected into the germanium light emission layer 309 at high density by making forward current flow between the p-type diffused layer electrode 5 and the n-type diffused layer electrode 6, an electron and a hole are recombined, and emission is made. Emitted light is strongly confined in the germanium light emission layer 309, when current that exceeds a threshold is made to flow, induced emission is caused, and a laser beam is oscillated. Extensional strain is applied to the light emission layer and an oscillation wavelength is approximately 1600 nm which is a designed wavelength. Since a laser beam is emitted in parallel to the silicon substrate 1, it is also validated that the device is optimum for an application such as on-chip optical wiring.

In FIGS. 19A, 19B, 19C, the process before a wiring step and the structure are shown. However, when an optical integrated circuit is formed, desired wiring has only to be performed afterward. Besides, when an electronic circuit is also mounted, some of the abovementioned steps can be performed at the same time as a process for forming a transistor. When the optical device is produced in a normal silicon process as described above, coexistence with an electronic device is easy. Especially, since the germanium laser diode equivalent to this embodiment can oscillate in the vicinity of 1550 nm at which the transmission loss of an optical fiber is small, it is clarified that the reliable and low-priced laser can be provided utilizing conventional type infrastructure for optical communication as it is.

According to this embodiment, the light-emitting element (the DFB laser diode) in which electrons can be efficiently injected into the light emission layer made of a Group IV element and which can efficiently emit can be provided. Besides, the intensity of emission can be enhanced by making the barrier layer nanowire structure.

Seventh Embodiment

A seventh embodiment will be described referring to FIGS. 1A, 20A, 1B, 24A, 25A, 1C, 24B, 23C below. The items described in the first embodiment and undescribed in this embodiment can also be applied to this embodiment unless there are special circumstances. In this embodiment, the following device is produced by a simple method using a normal silicon process. A Fabry-Perot (FP) germanium laser diode in which resistance is small and in which optical free carrier absorption by an electrode is small and its manufacturing method will be described below. This embodiment is different from the first embodiment in that a thin p-type diffused layer electrode and a thin n-type diffused layer electrode are provided in the vicinity of a germanium light emission layer.

Figure 24A:
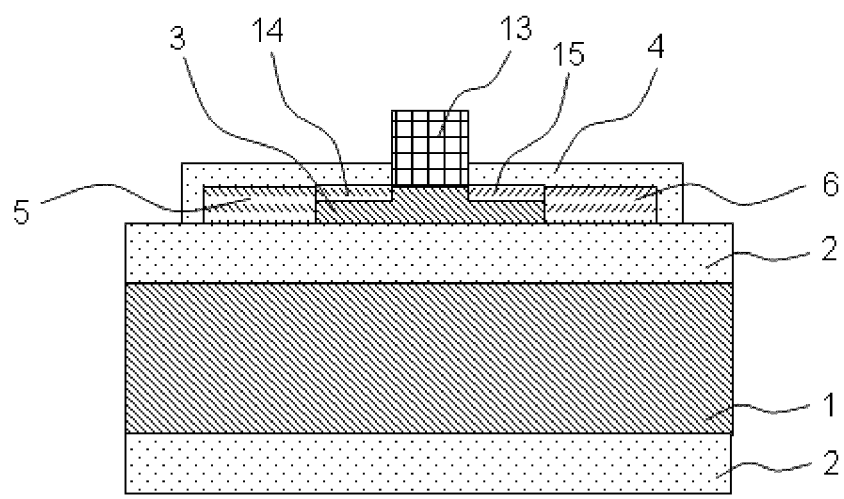
FIG. 24A is a sectional view for explaining the manufacturing process of the light-emitting element in the seventh embodiment and FIG. 24B is a sectional view for explaining the manufacturing processes of the light-emitting elements in the seventh and eighth embodiments.
Figure 24B:
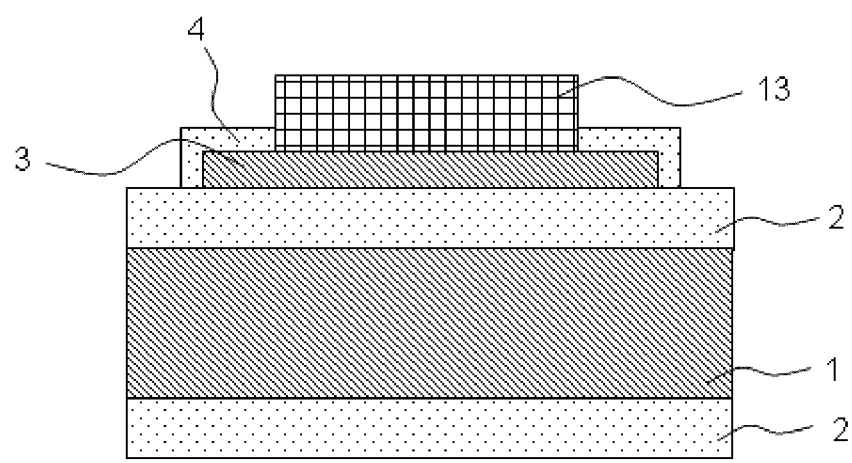
Figure 25A:
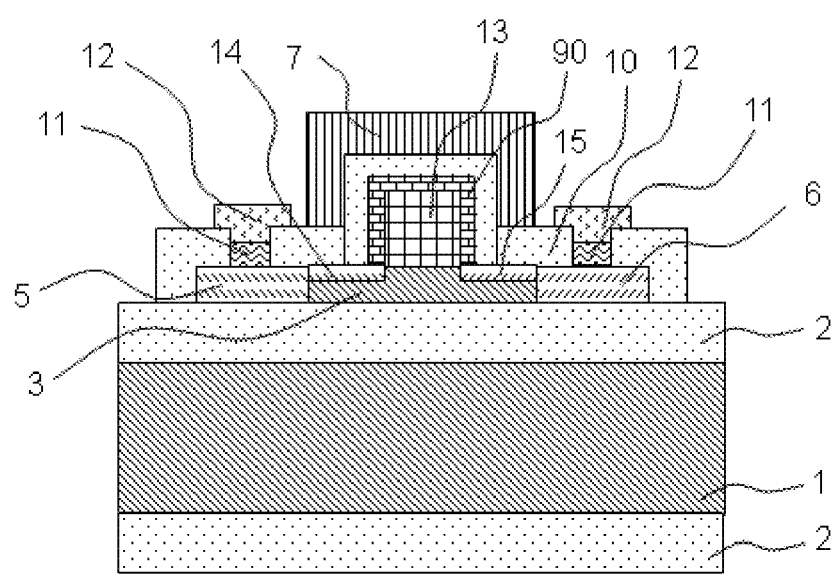
FIG. 25A is a sectional view showing the light-emitting element in the seventh embodiment.

FIGS. 1A, 24A, 25A, 1B, 24B, 23C show sectional structures of the light-emitting element in the order of a manufacturing process. Besides, FIGS. 1C, 20A, 23A are schematic diagrams showing the light-emitting element viewed from the upside in the order of the manufacturing process. In this case, FIGS. 24A, 25A, 24B, 23C show sectional structures when the light-emitting element is respectively cut along each horizontal line 23 and each vertical line 24 in FIGS. 20A, 23A. FIGS. 23A, 25A and 23C show the completed device in this embodiment.

The manufacturing process will be described in order below. The description of the manufacturing process shown in FIGS. 1A, 1B, 1C is omitted because the process is the same as that in the second embodiment.

After resist is applied from a state shown in FIGS. 1A, 1B, 1C, the SOI layer 3 is worked in a mesa shape by anisotropic dry etching after the resist is left in only a desired area by mask exposure by photolithography. The SOI layer can be isolated in a mesa shape in the step. Besides, in place of working the SOI layer 3 in a mesa shape as in this embodiment, the SOI layer may also be isolated by shallow trench isolation (STI) and local oxidation of Si (LOCOS).

Next, after a cleaning step, a surface of the SOI layer 3 is oxidized to protect the surface and a silicon dioxide layer having the thickness of approximately 30 nm is formed. The silicon dioxide layer not only reduces damage applied to the SOI layer 3 by ion implantation performed in the following process but inhibits the emission into the air of impurities by activating thermal treatment. At this time, a silicon dioxide layer is also formed on the underside. Besides, the silicon dioxide layer is not necessarily required to be formed by a thermal oxidation process and a step for depositing on only a surface using a device for chemical vapor deposition (CVD) and others may also be used.

Next, impurities are implanted in a desired area of the SOI layer 3 by ion implantation. In the implantation of impurities, first, a p-type diffused layer electrode 5 is formed in the SOI layer 3 by implanting $BF_2$ ions by a dose of "$1 \times 10^{15}/cm^2$" after resist is left in only a desired area by resist patterning using photolithography. Next, after the resist is removed, an n-type diffused layer 6 is formed in the SOI layer 3 by implanting P ions by a dose of "$1 \times 10^{15}/cm^2$" after resist is left in only a desired area by resist patterning using photolithography again. The p-type diffused layer 5 and the n-type diffused layer 6 function as an electrode for respectively injecting holes and electrons after the completion of the device. In this embodiment, an intrinsic semiconductor area in which no impurities are implanted is provided between the p-type diffused layer 5 and the n-type diffused layer 6 to prevent light propagated in the germanium light emission layer 13 from being absorbed in the p-type diffused layer 5 and the n-type diffused layer 6 after the completion of the device.

Next, a p-type diffused layer 14 shallower than the p-type diffused layer 5 and an n-type diffused layer 15 shallower than the n-type diffused layer 6 are formed by ion implantation. In the implantation of impurities, impurities are implanted only in the vicinity of the surface of the SOI layer 3 at suitable implantation energy after resist is left in only a desired area by resist patterning using photolithography.

In this ion implantation step, the SOI layer 3 in a part in which ions are implanted is made amorphous, the crystallinity is deteriorated. Then, it is important that only the surface of the SOI layer 3 is made amorphous and crystalline silicon is left in an area in which the SOI layer 3 is adjacent to the BOX layer 2 though it is shown in no drawing. Since the whole SOI layer 3 in an area in which ions are implanted is made amorphous when accelerating voltage in ion implantation is set to too high voltage, monocrystallinity is not recovered even if annealing is performed afterward and there occurs a problem that the SOI layer is made polycrystalline. In this embodiment, since the crystalline silicon layer is left in the area adjacent to the BOX layer 2 by implanting ions on a condition that only the surface of the SOI layer 3 is made amorphous, crystallinity can be recovered by activating thermal treatment and others after ion implantation. It is extremely important that monocrystallinity is fit for efficient emission.

Next, the impurities are activated by laser beam annealing and simultaneously, the crystallinity of the SOI layer 3 is recovered.

Next, after a silicon dioxide layer 4 is deposited overall using a device for CVD and others, an opening is provided to a desired area of the silicon dioxide layer 4 by leaving resist in only a desired area by resist patterning using photolithography and performing anisotropic dry etching. The silicon dioxide layer 4 is not necessarily required to be formed by CVD and may also be formed by a thermal oxidation process. Besides, for a working method, wet etching may also be used.

Next, after a cleaning step, a germanium layer 13 acquired by selectively doping in an n type in only an area in which the surface of the SOI layer 3 is exposed is epitaxially grown up to the thickness of 200 nm and states shown in FIGS. 20A, 24A and 24B are acquired. In this process of epitaxial growth, extensional strain is applied to the germanium layer 13 by difference in a coefficient of thermal expansion between the germanium layer and the silicon substrate 1 on the underside. In the drawings for this embodiment, the germanium light emission layer 13 is epitaxially grown so that it is connected to the intrinsic semiconductor area in which no impurities are implanted. However, an opening may be provided so that the germanium light emission layer is connected to the shallow p-type diffused layer 14 or the shallow n-type diffused layer 15 or both and the germanium light emission layer 13 may also be epitaxially grown.

However, to inhibit free photocarrier absorption by the diffused layer after the completion of the device, the germanium light emission layer 13 is required to be formed with the layer isolated from the p-type diffused layer 5 and the n-type diffused layer 6.

Since the shallow p-type diffused layer 14 and the shallow n-type diffused layer 15 are thin in film thickness, free carrier absorption is small even if they are provided in the vicinity of the germanium light emission layer 13.

Besides, since the germanium layer 13 functions not only as a light emission layer after the completion of the device but as an optical confinement layer, the germanium layer 13 is designed to be a linear optical resonator in this embodiment.

The description of steps from the states in FIGS. 20A, 24A, 24B to states in FIGS. 23A, 25A, 23C is omitted because these steps are the same as those in the first embodiment.

Referring to FIG. 25A, the configuration and operating characteristics of the device produced as described above, that is, the germanium laser will be described below.

The germanium light emission layer 13 is electrically connected to the p-type diffused layer electrode 5 and the n-type diffused layer electrode 6. The germanium light emission layer 13 is linearly worked and also functions as a Fabry-Perot optical resonator.

Carriers are injected into the germanium light emission layer 13 by making forward current flow between the p-type diffused layer electrode 5 and the n-type diffused layer electrode 6, an electron and a hole are recombined, and emission is made. Emitted light is strongly confined in the germanium light emission layer 13, when current that exceeds a threshold is made to flow, induced emission is caused, and a laser beam is oscillated. Extensional strain is applied to the light emission layer and an oscillation wavelength is approximately 1600 nm which is a designed wavelength. Since the p-type diffused layer 5 and the n-type diffused layer 6 in the vicinity of the light emission layer are two-dimensional electronic layers, the overlap of light propagated in the p-type diffused layer 5, the n-type diffused layer 6 and the germanium light emission layer decreases and free photocarrier absorption by the p-type diffused layer and the n-type diffused layer is reduced. As a result, threshold current can be reduced up to a half.

Since a laser beam is emitted in parallel to the silicon substrate 1, it is also validated that the device is optimum for an application such as on-chip optical wiring.

In the meantime, in FIGS. 23A, 25A, 23C, the process before a wiring step and the structure are shown. However, when an optical integrated circuit is formed, a desired wiring step has only to be performed afterward. Besides, when an electronic circuit is also mounted, some of the abovementioned steps can be performed at the same time as a process for forming a transistor. When the optical device is produced in a normal silicon process as described above, coexistence with an electronic device is easy. Especially, since the germanium laser diode according to the present invention can oscillate in the vicinity of 1550 nm at which the transmission loss of an optical fiber is small, it is clarified that the reliable and low-priced laser can be provided utilizing conventional type infrastructure for optical communication as it is.

According to this embodiment, since the loss of light caused by free carrier absorption in the p-type (n-type) diffused layer electrode is reduced in addition to effect in the first embodiment, the light-emitting element (the Fabry-Perot laser diode) in which electrons can be efficiently injected into the light emission layer made of a Group IV element and which can efficiently emit can be provided.

Eighth Embodiment

An eighth embodiment will be described referring to FIGS. 1A, 26A, 1B, 26B, 27A, 28A, 1C, 26C, 24B, 28B below. The items described in either of the first or seventh embodiment and undescribed in this embodiment can also be applied to this embodiment unless there are special circumstances. In this embodiment, a Fabry-Perot (FP) germanium laser diode where surface roughness of a germanium light emission layer produced by a method that enables easy formation using a normal silicon process is reduced and its manufacturing method will be described. This embodiment is different from the first embodiment in that a (111) plane of silicon flat at a level of an atomic layer is adjacent to a growth surface to be a germanium light emission layer of Si (SOI) (an interface between Ge and Si).

Figure 26A:
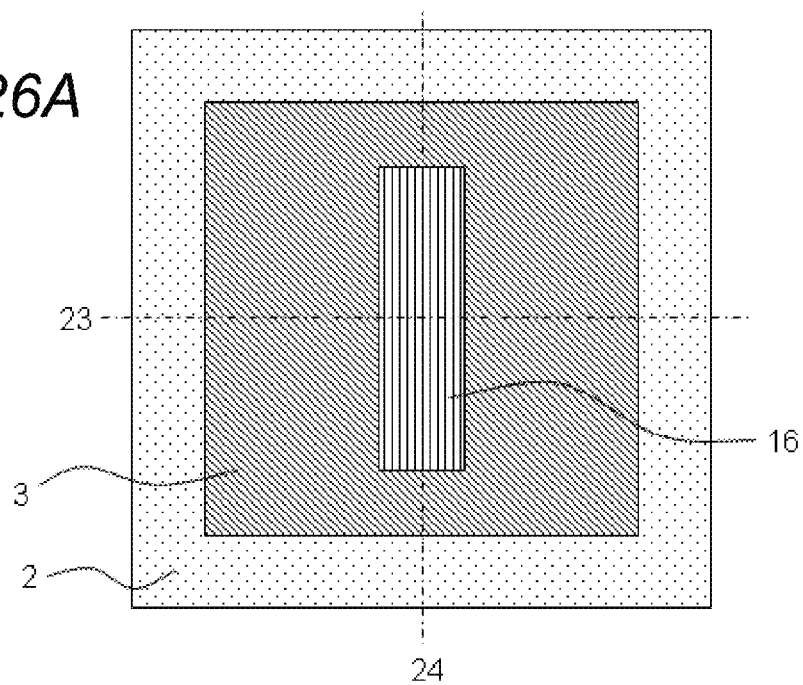
FIG. 26A is a sectional top view for explaining the manufacturing process of the light-emitting element in the eighth embodiment.
Figure 26B:
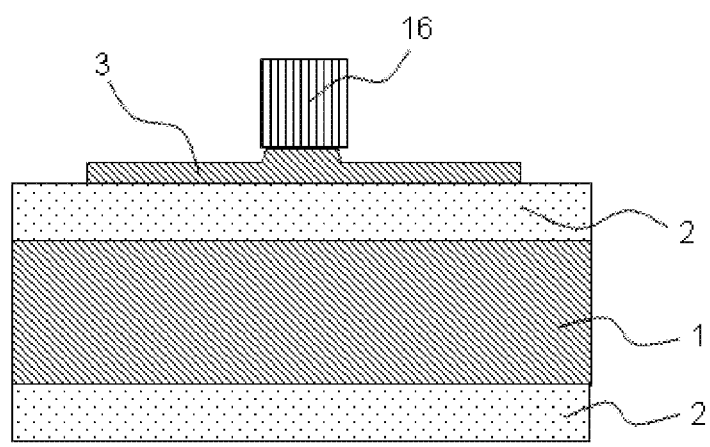
FIG. 26B is a sectional view for explaining the manufacturing process of the light-emitting element in the eighth embodiment.
Figure 26C:
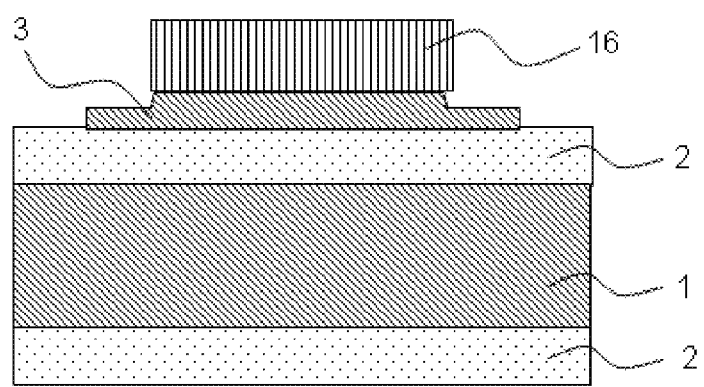
FIG. 26C is a sectional view for explaining the manufacturing process of the light-emitting element in the eighth embodiment.
Figure 27A:
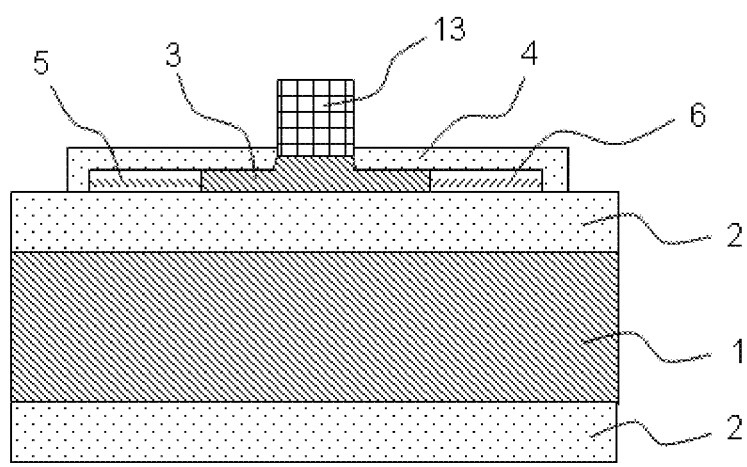
FIG. 27A is a sectional view for explaining the manufacturing process of the light-emitting element in the eighth embodiment.
Figure 28A:
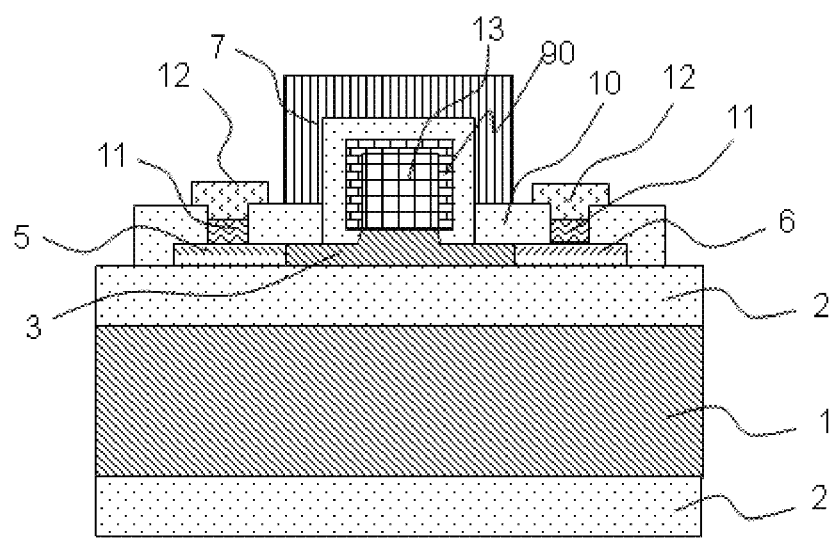
FIG. 28A is a sectional view showing the light-emitting element in the eighth embodiment and FIG. 28B is a sectional view showing the light-emitting element in the eighth embodiment.
Figure 28B:
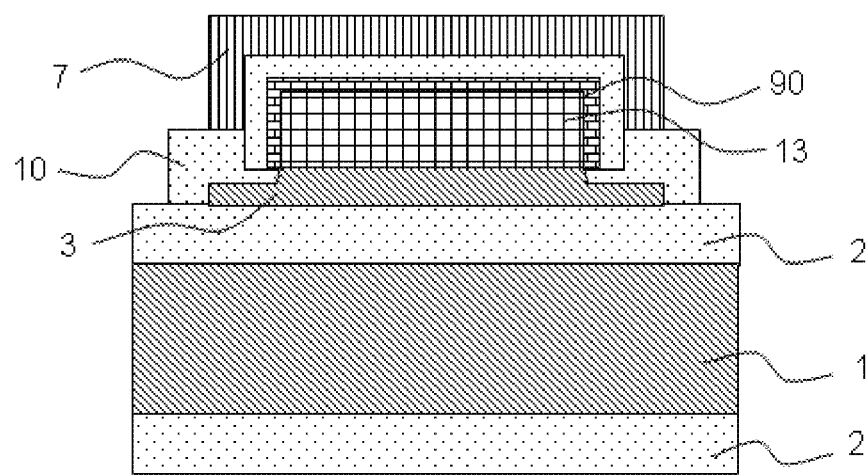

FIGS. 1A, 26B, 27A, 28A, 1B, 26C, 24B and 28B show sectional structures of the light-emitting element in the order of the manufacturing process. Besides, FIGS. 1C, 26A and 23A are schematic diagrams showing the light-emitting element viewed from the upside in the order of the manufacturing process. In this case, FIGS. 1A, 26B, 28A, 1B, 26C and 28B show the sectional structures when the light-emitting element is respectively cut along each horizontal line 23 and each vertical line 24 in FIGS. 1C, 26A, 23A. FIGS. 23A, 28A and 28B show the completed device in this embodiment.

A manufacturing process will be described in order below.

The description of the manufacturing process shown in FIGS. 1A, 1B, 1C is omitted because the process is the same as that in the second embodiment. After resist is applied from a state shown in FIGS. 1A, 1B, 1C, the SOI layer 3 is worked in a mesa shape by anisotropic dry etching after the resist is left in only a desired area by mask exposure by photolithography. The SOI layer is isolated in an insular (a mesa) shape by this step. Besides, in place of working the SOI layer 3 in a mesa shape as in this embodiment, the SOI layer may also be isolated by shallow trench isolation (STI), local oxidation of Si (LOCOS) and others.

Next, after a cleaning step, resist is left in only a desired area by resist patterning using photolithography after a surface of the SOI layer 3 is oxidized to protect the surface and a silicon dioxide layer having the thickness of 3 nm and a silicon nitride layer 16 having the thickness of 50 nm are deposited overall and the silicon nitride layer 16 is worked in a desired shape by anisotropic dry etching. Since a germanium light emission layer 13 is epitaxially grown in the area in which the silicon nitride 16 is provided in the following process, the germanium light emission layer 13 is required to be designed and worked so that the germanium light emission layer is operated as an FP optical resonator, a DBR optical resonator, a DFB optical resonator or a ring type optical resonator at that time.

Next, after a proper cleaning step, the anisotropic wet etching of the SOI layer 3 using an alkaline chemical is performed after a part of the SOI layer 3 is exposed by wet etching using hydrofluoric acid.

In the wet etching of the SOI layer 3, an etching condition is adjusted so that a (100) plane of the SOI layer 3 is etched by approximately 10 nm. Besides, since a rate of wet etching greatly depends upon crystal orientation and an etching rate on the SOI layer 3 is slower than that on the (100) plane, a (111) plane flat at the level of the atomic layer is formed on the surface of the SOI layer 3 in the vicinity of the silicon nitride layer 16, and a state shown in FIGS. 6A, 6B, 6C is acquired.

Next, after a cleaning step, the surface of the SOI layer 3 is oxidized to protect the surface and a silicon dioxide layer 4 having the thickness of 30 nm is formed.

The silicon dioxide layer 4 not only reduces damage applied to the SOI layer 3 by ion implantation performed in the following process but inhibits the emission into the air of impurities by activating thermal treatment. At this time, a silicon dioxide layer is also formed on the underside.

Next, impurities are implanted in a desired area of the SOI layer 3 by ion implantation. In the implantation of impurities, first, a p-type diffused layer electrode 5 is formed in the SOI layer 3 by implanting $BF_2$ ions by a dose of "$1\times10^{15}/cm^2$" after n resist is left in only a desired area by resist patterning using photolithography. Next, after the resist is removed, an n-type diffused layer 6 is formed in the SOI layer 3 by implanting P ions by a dose of "$1\times10^{15}/cm^2$" after resist is left in only a desired area by resist patterning using photolithography again. The p-type diffused layer 5 and the n-type diffused layer 6 function as an electrode for respectively injecting holes and electrons after the completion of the device. Since the silicon nitride layer 16 functions as a hard mask for ion implantation in this embodiment, an ion implantation area can be precisely controlled up to the extreme vicinity of the silicon nitride layer 16 in ion implantation.

In this ion implantation step, since the SOI layer 3 in a part in which ions are implanted is made amorphous, the crystallinity is deteriorated. Then, it is important that only the surface of the SOI layer 3 is made amorphous and crystalline silicon is left in an area in which the SOI layer 3 is adjacent to the BOX layer 2 though it is not shown in the drawings. Since the whole SOI layer 3 in the area in which ions are implanted is made amorphous when accelerating voltage for ion implantation is set to too high voltage, there occurs a problem that monocrystallinity is not recovered even if annealing is performed afterward and the whole SOI layer in the area is made polycrystalline. In this embodiment, since a crystalline silicon layer is left in the area adjacent to the BOX layer 2 by performing ion implantation on a condition that only the surface of the SOI layer 3 is made amorphous, the crystallinity can be recovered by activating thermal treatment and others after ion implantation. It is extremely important that monocrystallinity is fit for efficient emission.

Next, impurities are activated by annealing in an atmosphere of nitrogen of 900° C. for 20 minutes and simultaneously, the crystallinity of the SOI layer 3 is recovered. Next, after the silicon nitride layer is removed by wet etching using heated phosphoric acid and cleaning, a part of the silicon dioxide layer is opened by wet etching using hydrofluoric acid and the SOI layer 3 is exposed. At this time, high linearity at the level of the atomic layer is given to an end of the opening by anisotropic wet etching.

Next, after a cleaning step, a germanium layer 13 acquired by selectively doping in an n type in only an area in which the surface of the SOI layer 3 is exposed is epitaxially grown up to the thickness of 200 nm and states shown in FIGS. 27A and 24B are acquired. In this process of epitaxial growth, extensional strain is applied to the germanium layer 13 by difference in a coefficient of thermal expansion between the germanium layer and the silicon substrate 1 on the underside. In the drawings for this embodiment, the germanium light emission layer 13 is epitaxially grown so that it is connected to an intrinsic semiconductor area in which no impurities are implanted. However, an opening may be provided so that the germanium light emission layer is connected to the p-type diffused layer 5 or the n-type diffused layer 6 or both and the germanium light emission layer 13 may also be epitaxially grown.

Besides, since the germanium layer 13 functions not only as a light emission layer after the completion of the device but as an optical confinement layer, the germanium layer 13 is designed to be a linear optical resonator in this embodiment.

In this embodiment, since the germanium light emission layer 13 is grown in the opening having the end the linearity of which is high at the level of the atomic layer, the roughness of a side wall of the germanium light emission layer 13 is reduced and loss by the scattering of light propagated in the germanium light emission layer 13 is reduced.

Besides, as shown in FIG. 21, a mirror of a distributed Bragg reflector (DBR) is formed by arranging pieces made of germanium or amorphous silicon in the vicinities of both ends in a longitudinal direction of the germanium light emission layer 13 linearly worked at a periodic interval and a DBR germanium laser diode can also be produced. The DBR mirror is a dielectric mirror configured based upon difference in a refractive index with an ambient insulating film and high reflectance of 99.9% or more can be achieved. Since such a mirror having high reflectance can be simply formed in a silicon process, laser oscillation can be achieved even if emission from germanium is feeble. In the design of the DBR mirror, the width and an interval of each piece made of amorphous silicon are important parameters and they are designed so that they are integral times of approximately a half of an emission wavelength in a medium.

In addition, as shown in FIG. 22, a distributed feed-back (DFB) laser where the germanium layer 13 functions not only as a light emission layer after the completion of the device but as an optical confinement layer in which the periodic variation of a refractive index can be applied to propagated light by designing so that the width of the germanium layer 13 periodically varies can also be produced. Besides, though the following is not shown in the drawings for this embodiment, a ring type laser where the germanium layer 13 functions not only as a light emission layer after the completion of the device but as a ring type optical confinement layer which is free of loss by reflection on an end face of an optical waveguide by designing the germanium layer 13 in a ring type can also be produced.

The description of steps from states shown in FIGS. 20A, 27A and 24B to states shown in FIGS. 23A, 28A and 28B is omitted because these steps are the same as those in the first embodiment.

Referring to FIG. 28A, the configuration and operating characteristics of the device produced as described above, that is, the germanium laser will be described below.

The germanium light emission layer 13 is electrically connected to the p-type diffused layer electrode 5 and the n-type diffused layer electrode 6. The germanium light emission layer 13 is linearly worked and also functions as a Fabry-Perot optical resonator.

Carriers are injected into the germanium light emission layer 13 by making forward current flow between the p-type diffused layer electrode 5 and the n-type diffused layer electrode 6, an electron and a hole are recombined, and emission is made. At this time, emitted light is strongly confined in the germanium light emission layer 13 between the p-type diffused layer 5 and the n-type diffused layer 6, when current that exceeds a threshold is made to flow, induced emission is caused, and a laser beam is oscillated. Extensional strain is applied to the light emission layer and an oscillation wavelength is approximately 1600 nm which is a designed wavelength.

In this embodiment, since the germanium light emission layer 13 is grown in the opening having the end the linearity of which is high at the level of the atomic layer, the roughness of the side wall of the germanium light emission layer 13 is reduced and loss by the scattering of light propagated in the germanium light emission layer 13 is reduced. As a result, threshold current can be reduced to a half.

Since a laser beam is emitted in parallel to the silicon substrate 1, it is also validated that the device is optimum for an application such as on-chip optical wiring.

In FIGS. 23A, 28A, 28B, the process before a wiring step and the structure are shown. However, when an optical integrated circuit is formed, a desired wiring step has only to be performed afterward. Besides, when an electronic circuit is also mounted, some of the abovementioned steps can be performed at the same time as a process for forming a transistor. When an optical device is produced in a normal silicon process as described above, coexistence with an electronic device is easy. Especially, since the germanium laser diode according to the present invention can oscillate in the vicinity of 1550 nm at which the transmission loss of an optical fiber is small, it is clarified that the reliable and low-priced laser can be provided utilizing conventional type infrastructure for optical communication as it is.

According to this embodiment, since Ge can be epitaxially grown on a growth surface of the Ge light emission layer worked based upon linearity at the level of the atomic layer, the surface roughness of the side of the Ge light emission layer is reduced. As a result, loss by the scattering of light is reduced, electrons can be efficiently injected into the light emission layer made of a Group IV element, and the light-emitting element (the Fabry-Perot laser diode) that can emit efficiently can be provided.

Ninth Embodiment

A ninth embodiment will be described referring to FIGS. 1A, 29A, 1B, 29B, 30A, 1C, 29C, 30B below. The items described in the first or seventh embodiment and undescribed in this embodiment can also be applied to this embodiment unless there are special circumstances. In this embodiment, a DFB germanium laser diode using a single crystal (hereinafter called a fin) formed perpendicularly to a substrate and its manufacturing method are disclosed.

FIGS. 1A, 29B, 30A, 1B, 29C and 30B show sectional structures of the light-emitting element in the order of a manufacturing process. Besides, FIGS. 1C, 29A and 23A are schematic diagrams showing the light-emitting element viewed from the upside in the order of the manufacturing process.

Figure 29A:
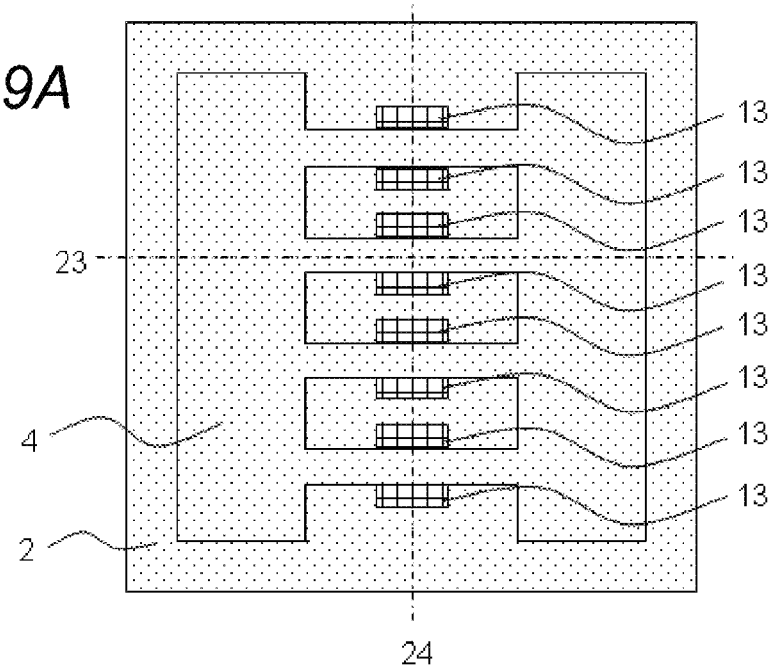
FIG. 29A is a schematic top view for explaining the manufacturing process of the light-emitting element in the ninth embodiment.

In this case, FIGS. 1A, 29B, 30A, 1B, 29C and 30B show the sectional structures when the light-emitting element is cut along each horizontal line 23 and each vertical line 24 in FIGS. 1C, 29A, 23A.

Figure 30A:
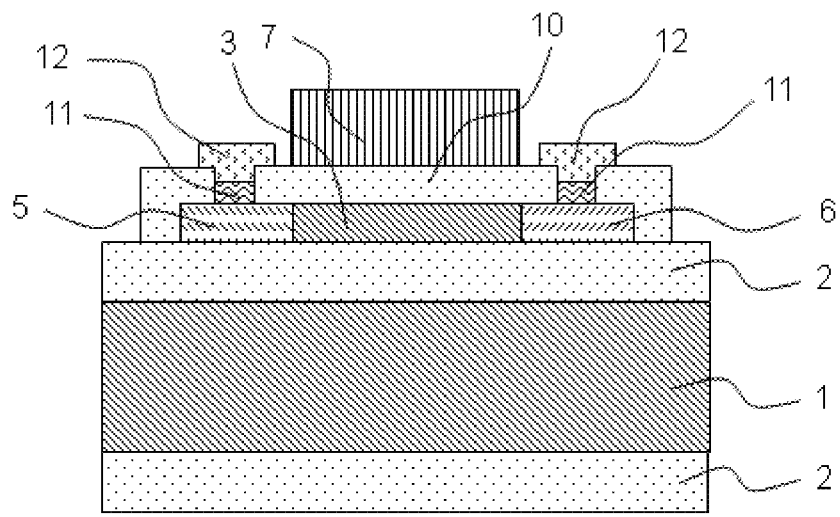
FIG. 30A is a sectional view showing the light-emitting element in the ninth embodiment and FIG. 30B is a sectional view showing the light-emitting element in the ninth embodiment.
Figure 30B:
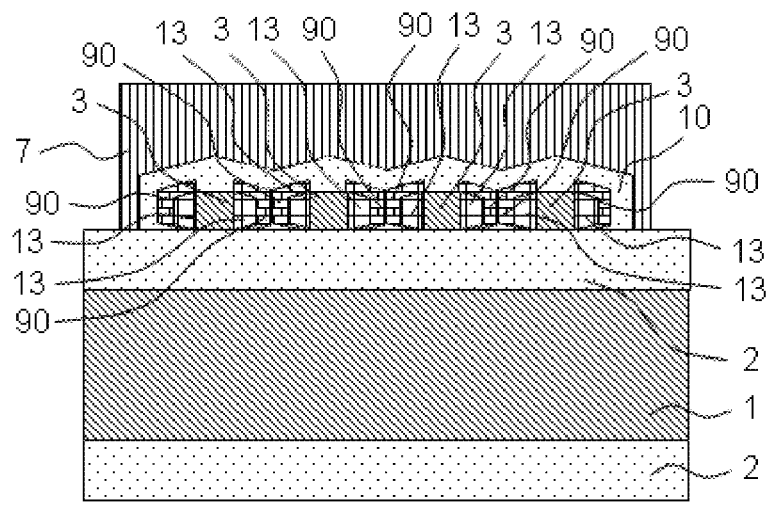
Figure 31:
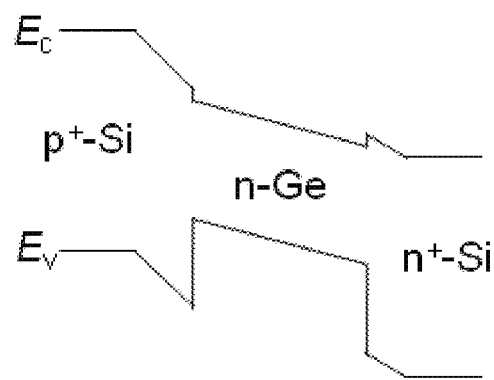
FIG. 31 is a schematic diagram showing band structure acquired by the heterojunction of $p^+Si/n^-Ge/n^+Si$.
Figure 32:
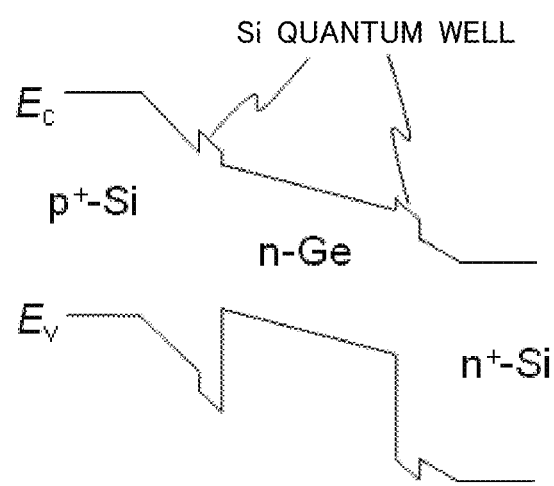
FIG. 32 is a schematic diagram showing band structure acquired by the heterojunction of $p^+Si$/an $Si$ quantum well/ $n^-Ge$/an $Si$ quantum well/$n^+Ge$.

FIGS. 23A, 30A and 30B show the completed device in this embodiment.

The manufacturing process will be described in order below. In this embodiment, fin structure is applied to the light emission part made of germanium in the first embodiment.

The description of the manufacturing process shown in FIGS. 1A, 1B, 1C is omitted because it is the same as that in the second embodiment.

After resist is applied from a state shown in FIGS. 1A, 1B, 1C, the SOI layer 3 is worked in a mesa shape by anisotropic dry etching after the resist is left in only a desired area by mask exposure by photolithography. In this step, the SOI layer is isolated in the insular (mesa) shape. Besides, the SOI layer 3 is worked in the shape of a fin.

Next, after a cleaning step, a surface of the SOI layer 3 is oxidized to protect the surface and a silicon dioxide layer having the thickness of approximately 30 nm is formed. The silicon dioxide layer not only reduces damage applied to the SOI layer 3 by ion implantation performed in the following process but inhibits the emission into the air of impurities by activating thermal treatment. At this time, a silicon dioxide layer is also formed on the underside. The silicon dioxide layer is not necessarily required to be formed by a thermal oxidation process and a process for depositing only on a surface using a device for chemical vapor deposition (CVD) and others may also be used.

Next, impurities are implanted in a desired area of the SOI layer 3 by ion implantation. In the implantation of impurities, first, a p-type diffused layer electrode 5 is formed in the SOI layer 3 by implanting $BF_2$ ions by a dose of "$1\times10^{15}/cm^2$" after n resist is left in only a desired area by resist patterning using photolithography. Next, after the resist is removed, an n-type diffused layer 6 is formed in the SOI layer 3 by implanting P ions by a dose of "$1\times10^{15}/cm^2$" after resist is left in only a desired area by resist patterning using photolithography again. The p-type diffused layer 5 and the n-type diffused layer 6 function as an electrode for respectively injecting holes and electrons after the completion of the device. In this embodiment, an intrinsic semiconductor area in which no impurities are implanted is provided between the p-type diffused layer 5 and the n-type diffused layer 6. However, no intrinsic semiconductor area may be provided and the implantation of impurities may also be performed so that the p-type diffused layer 5 and the n-type diffused layer 6 are directly connected.

In this ion implantation step, since the SOI layer 3 in a part in which ions are implanted is made amorphous, the crystallinity is deteriorated. Then, though the following is not shown in the drawings, it is important that only the surface of the SOI layer 3 is made amorphous and crystalline silicon is left in an area in which the SOI layer 3 is adjacent to the BOX layer 2.

Since the whole SOI layer 3 in the area in which ions are implanted is made amorphous when accelerating voltage for ion implantation is set to too high voltage, there occurs a problem that the monocrystallinity is not recovered even if annealing is performed afterward and the whole SOI layer is made polycrystalline. In this embodiment, since a crystalline silicon layer is left in the area adjacent to the BOX layer 2 by implanting ions on a condition that only the surface of the SOI layer 3 is made amorphous, the crystallinity can be recovered by activating thermal treatment and others after ion implantation. It is extremely important that monocrystallinity is fit for efficient emission.

Next, the impurities are activated by annealing in an atmosphere of nitrogen of 900° C. for 20 minutes and simultaneously, the crystallinity of the SOI layer 3 is recovered.

Next, after a silicon dioxide layer 4 is deposited overall using a device for CVD and others, resist is left in only a desired area by resist patterning using photolithography and an opening is provided in a desired area of the silicon dioxide layer 4 by etching using hydrofluoric acid. The silicon dioxide layer 4 is not necessarily required to be formed by CVD and may also be formed by a thermal oxidation process.

Figure 29B:
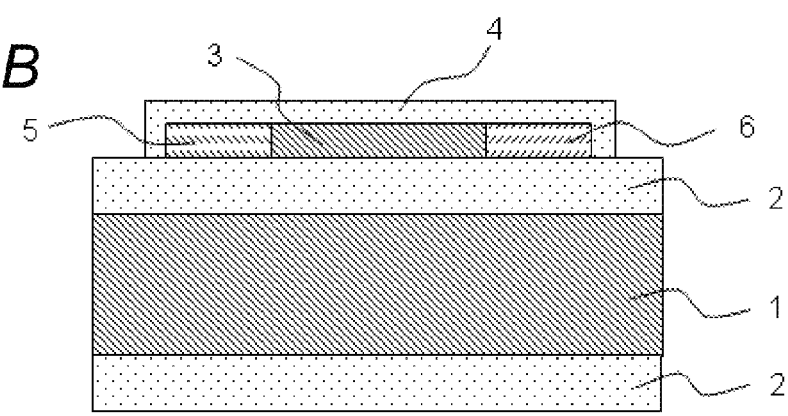
FIG. 29B is a sectional view for explaining the manufacturing process of the light-emitting element in the ninth embodiment.
Figure 29C:
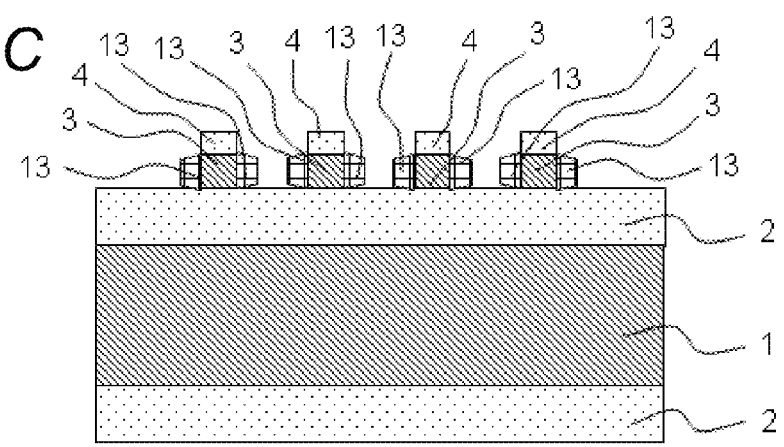
FIG. 29C is a sectional view for explaining the manufacturing process of the light-emitting element in the ninth embodiment.

Next, after a cleaning step, a germanium layer 13 selectively doped in an n type in only an area in which the surface of the SOI layer 3 is exposed is epitaxially grown up to the thickness of 200 nm and a state shown in FIGS. 29A, 29B, 29C is acquired. In this process of epitaxial growth, extensional strain is applied to the germanium layer 13 by difference in a coefficient of thermal expansion with the silicon substrate 1 on the underside. In the drawings for this embodiment, the germanium light emission layer 13 is epitaxially grown so that it is connected to the intrinsic semiconductor area in which no impurities are implanted. However, an opening may be provided so that the germanium light emission layer is connected to the p-type diffused layer 5 or the n-type diffused layer 6 or both and the germanium light emission layer 13 may also be epitaxially grown.

Besides, the germanium light emission layer 13 is periodically arrayed with the germanium light emission layer in contact with a fin shape and functions not only as a light emission layer after completion of the device but as an optical confinement layer.

The device is designed so that a refractive index of an optical waveguide periodically varies by periodically providing fins and the completed device functions as a distributed feed-back (DFB) laser.

The description of a step from the state shown in FIGS. 29A, 29B, 29C to states shown in FIGS. 23A, 30A, 30B is omitted because the step is the same as that in the first embodiment.

Referring to FIG. 30A, the configuration and operating characteristics of the abovementioned device, that is, the germanium laser will be described below.

The germanium light emission layer 13 is electrically connected to the p-type diffused layer electrode 5 and the n-type diffused layer electrode 6 via the SOI layer 3 worked in the fin shape. As the SOI layer is formed in the fin shape having three-dimensional structure, current injection efficiency into the germanium light emission layer 13 is enhanced by arbitrarily increasing the height and the density of the fin and the intensity of emission can be increased. The germanium light emission layer 13 is worked in plural pieces periodically arrayed and also functions as a DFB optical resonator. In the design of the DFB mirror, the width and an interval of each piece of the germanium layer 13 are important parameters and are designed so that they are integral times of approximately a half of an emission wavelength in a medium.

Carriers are injected into the germanium light emission layer 13 at high density by making forward current flow between the p-type diffused layer electrode 5 and the n-type diffused layer electrode 6, an electron and a hole are recombined, and emission is made. The emitted light is strongly confined in the germanium light emission layer 13, when current that exceeds a threshold is made to flow, induced emission is caused, and a laser beam is oscillated. Extensional strain is applied to the light emission layer and an oscillation wavelength is approximately 1600 nm which is a designed wavelength. Since a laser beam is emitted in parallel to the silicon substrate 1, it is also validated that the device is optimum for an application such as on-chip optical wiring.

FIGS. 23A, 30A and 30B show the process and the structures before a wiring step. However, when an optical integrated circuit is formed, a desired wiring step has only to be performed afterward. Besides, when an electronic circuit is also mounted, some of the abovementioned steps can be simultaneously performed at the same time as a process for forming a transistor. When the optical device is produced in a normal silicon process as described above, coexistence with an electronic device is easy. Especially, since the germanium laser diode equivalent to this embodiment can oscillate in the vicinity of 1550 nm at which the transmission loss of an optical fiber is small, it is clarified that the reliable and low-priced laser can be provided utilizing conventional type infrastructure for optical communication as it is.

According to this embodiment, the light-emitting element (the DFB laser diode) in which electrons can be efficiently injected into the light emission layer made of a Group IV element and which can emit efficiently can be provided. Besides, the current injection efficiency into the germanium light emission layer 13 is enhanced by forming in the fin shape having three-dimensional structure and the intensity of emission can be increased.

While the present invention has been described in detail, the main embodiments of the present invention will be listed below.

(1) A semiconductor optical element which is provided with an insulating layer, a barrier layer extended from a first region to a second region on the insulating layer and made of a single crystal including a first Group IV element, a first electrode connected to the barrier layer in the first region and having a first conductive type, a light emission part provided with the light emission part in contact with the barrier layer in the second region and made of a single crystal including a second Group IV element and a second electrode connected to the light emission part and having a second conductive type and which has a characteristic that the barrier layer has thickness in which quantum confinement effect manifests and a distance from the first region to the second region is longer than a size in which tunnel effect manifests.

(2) A semiconductor optical element which is provided with a substrate having an insulating layer on it, a barrier layer provided on the insulating layer, worked in a size in which quantum confinement effect manifests and made of a single crystal including a first Group IV element, a first electrode connected to one end of the barrier layer and having a first conductive type, a second electrode connected to the other end of the barrier layer and having a second conductive type and a light emission part provided with the light emission layer in contact with the barrier layer between the first and second electrodes and made of a single crystal including a second Group IV element and which has a characteristic that current that flows between the first and second electrodes flows in a horizontal direction to the substrate in at least a part of the barrier layer and light is emitted from the light emission part.

(3) A semiconductor optical element which has a characteristic that the semiconductor optical element is provided with a substrate, monocrystalline silicon provided on the substrate, monocrystalline germanium provided on the monocrystalline silicon, first and second electrodes provided on the substrate and connected to the monocrystalline silicon.

According to the present invention, the light-emitting element in which electrons can be efficiently injected into the light emission layer made of the Group IV element and which can emit efficiently can be provided.

The present invention is not limited to the abovementioned embodiments and includes various variations. For example, the abovementioned embodiments have been described in detail to simplify the explanation of the present invention and are not necessarily limited to the described all configurations. Besides, a part of the configuration in one embodiment can also be replaced with the configuration in another embodiment and in addition, the configuration in one embodiment can also be added to the configuration in another embodiment. Further, the addition, the deletion and the replacement of another configuration can be applied to a part of the configuration in each embodiment.

LIST OF REFERENCE SIGNS

1 - - - Silicon substrate, 2 - - - Silicon dioxide layer (BOX layer), 3 - - - SOI layer, 4 - - - Silicon dioxide layer, 5 - - - p-type diffused layer (p-type diffused layer electrode), 6 - - - n-type diffused layer (n-type diffused layer electrode), 7 - - - Silicon nitride layer, 8 - - - Silicon dioxide layer, 9 - - - Germanium layer (Light emission layer), 10 - - - Silicon dioxide layer, 11 - - - TiN electrode, 12 - - - Al electrode, 13 - - - Germanium layer (Light emission layer), 14 - - - p-type diffused layer, 15 - - - n-type diffused layer, 16 - - - Silicon nitride layer, 23—Horizontal cutting-plane line, 24 - - - Vertical cutting-plane line, 90 - - - Germanium dioxide layer, 106 - - - Silicon nitride layer, 107 - - - Silicon dioxide layer, 108 - - - Germanium layer (Light emission layer), 109 - - - n-type diffused layer electrode, 110 - - - Silicon dioxide layer, 111 - - - TiN electrode, 112 - - - Al electrode, 201 - - - Silicon substrate, 202 - - - Silicon dioxide layer (BOX layer), 203 - - - SOI layer, 204 - - - Silicon dioxide layer, 205 - - - p-type diffused layer (p-type diffused layer electrode), 206 - - - n-type diffused layer (n-type diffused layer electrode), 207 - - - Germanium layer (Light emission layer), 208 - - - Silicon dioxide layer, 209 - - - TiN electrode, 210 - - - Al electrode, 303 - - - SOI layer, 307 - - - Silicon nitride layer, 308 - - - Silicon dioxide layer, 309 - - - Germanium layer (Light emission layer), 310 - - - Silicon dioxide layer, 311 - - - TiN electrode, 312 - - - Al electrode, 409 - - - Germanium layer (Light emission layer), 410 - - - Silicon dioxide layer, 411 - - - TiN electrode, 412 - - - Al electrode.

The invention claimed is:
1. A semiconductor optical element, comprising:
an insulating layer;
a barrier layer extended from a first region to a second region respectively on the insulating layer and made of a single crystal including a first Group IV element;
a first electrode connected to the barrier layer in the first region and having a first conductive type;
a light-emitting part provided in the second region in contact with the barrier layer and made of a single crystal including a second Group IV element; and a second electrode connected to the light-emitting part and having a second conductive type, wherein the barrier layer has thickness in which quantum confinement effect manifests; and a distance from the first region to the second region is longer than a size in which tunnel effect manifests.

2. The semiconductor optical element according to claim 1, wherein the second electrode is provided in contact with the light-emitting part.

3. A semiconductor optical element, comprising:

a substrate to which an insulating layer is provided;

a barrier layer provided on the insulating layer, worked in a size in which quantum confinement effect manifests and made of a single crystal including a first Group IV element;

a first electrode connected to one end of the barrier layer and having a first conductive type;

a second electrode connected to the other end of the barrier layer and having a second conductive type; and a light-emitting part provided in contact with the barrier layer between the first and second electrodes and made of a single crystal including a second Group IV element, wherein current that flows between the first and second electrodes flows in a horizontal direction with respect to the substrate in at least a part of the barrier layer and light is emitted from the light-emitting part.

4. The semiconductor optical element according to claim 3, wherein the substrate is a silicon substrate;

the insulating layer is a silicon dioxide layer;

the first Group IV element is silicon or germanium; and the second Group IV element is germanium or germanium-tin alloy.

5. The semiconductor optical element according to claim 4, wherein the first conductive type is a p type; and the second conductive type is an n type.

6. The semiconductor optical element according to claim 5, wherein the thickness of the barrier layer worked in a size in which quantum confinement effect manifests has a finite value of 10 nm or less.

7. The semiconductor optical element according to claim 6, wherein the barrier layer is made of monocrystalline silicon having a (111) plane on its surface or monocrystalline germanium having a (100) plane on its surface.

8. The semiconductor optical element according to claim 5, wherein the barrier layer is formed in the shape of one or a plurality of wires arrayed in parallel to a principal plane of the substrate; and the thickness and the width of each wire of the barrier layer have a finite value of 10 nm or less.

9. The semiconductor optical element according to claim 5, wherein the barrier layer is made of monocrystalline silicon.

10. The semiconductor optical element according to claim 9, wherein the barrier layer is formed in the shape of one or a plurality of fins arrayed perpendicularly to a principal plane of the substrate;

the height of each fin of the barrier layer is 10 nm or more; and the thickness of each fin has a finite value of 10 nm or less.

11. The semiconductor optical element according to claim 6, wherein the first electrode, the barrier layer and the light-emitting part are arranged in parallel to a principal plane of the silicon substrate; and the first electrode, the barrier layer and the light-emitting part are provided adjacent to the silicon dioxide layer.

12. A semiconductor optical element, comprising:

a substrate;

monocrystalline silicon provided on the substrate;

monocrystalline germanium provided on the monocrystalline silicon; and first and second electrodes provided on the substrate and connected to the monocrystalline silicon.

13. The semiconductor optical element according to claim 12, wherein the monocrystalline germanium is periodically arranged on the substrate.

14. The semiconductor optical element according to claim 13, wherein the monocrystalline germanium is covered with an oxide film.

15. The semiconductor optical element according to claim 14, wherein a part of the monocrystalline silicon is formed in the shape of a fin; and the monocrystalline germanium is connected to the fin.

16. The semiconductor optical element according to claim 15, wherein an end connected to the monocrystalline germanium of the monocrystalline silicon has a (111) plane.

17. The semiconductor optical element according to claim 12, further comprising:

a dielectric provided along the monocrystalline germanium, wherein the dielectric applies extensional strain to the monocrystalline germanium.

* * * * *